United States Patent
Suzuki

(10) Patent No.: US 10,663,492 B2
(45) Date of Patent: May 26, 2020

(54) CURRENT SENSOR

(71) Applicant: Asahi Kasei Microdevices Corporation, Tokyo (JP)

(72) Inventor: Kenji Suzuki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 162 days.

(21) Appl. No.: 15/832,778

(22) Filed: Dec. 6, 2017

(65) Prior Publication Data

US 2018/0156845 A1  Jun. 7, 2018

(30) Foreign Application Priority Data

Dec. 7, 2016 (JP) .................................. 2016-237478
Jan. 13, 2017 (JP) .................................. 2017-004691

(51) Int. Cl.
  *G01R 15/20* (2006.01)

(52) U.S. Cl.
  CPC ......... *G01R 15/202* (2013.01); *G01R 15/207* (2013.01)

(58) Field of Classification Search
  USPC ......................................... 324/117 R, 117 H
  See application file for complete search history.

(56) References Cited

U.S. PATENT DOCUMENTS

| | | |
|---|---|---|
| 6,472,878 B1 | 10/2002 | Bruchmann |
| 2005/0045359 A1 | 3/2005 | Doogue et al. |
| 2011/0006763 A1 | 1/2011 | Bakker |
| 2014/0253103 A1 | 9/2014 | Racz et al. |
| 2016/0187388 A1 | 6/2016 | Suzuki et al. |
| 2016/0223594 A1 | 8/2016 | Suzuki et al. |
| 2016/0274196 A1* | 9/2016 | Takaki .................... H01L 43/08 |

FOREIGN PATENT DOCUMENTS

| | | |
|---|---|---|
| JP | H11237395 A | 8/1999 |
| JP | 2003098195 A | 4/2003 |
| JP | 2003172750 A | 6/2003 |
| JP | 2004061380 A | 2/2004 |
| JP | 2005123478 A | 5/2005 |
| JP | 2005283451 A | 10/2005 |
| JP | 2006184269 A | 7/2006 |
| JP | 2009156802 A | 7/2009 |
| JP | 2015152363 A | 8/2015 |
| JP | 2016223808 A | 12/2016 |
| WO | 2016056135 A1 | 4/2016 |

* cited by examiner

*Primary Examiner* — Vincent Q Nguyen

(57) ABSTRACT

To provide a current sensor with high sensitivity, provided is a current sensor including a sealing portion; a first conductor that includes a bent portion bent in a planar view within the sealing portion and two end portions that are exposed from the sealing portion; a second conductor that includes a bent portion bent in the planar view within the sealing portion and two end portions that are exposed from the sealing portion; a first magnetic sensor that is provided within the sealing portion and arranged inside the first conductor in the planar view; and a second magnetic sensor that is provided within the sealing portion and arranged inside the second conductor in the planar view, wherein one end portion of the first conductor and one end portion of the second conductor are electrically connected.

20 Claims, 21 Drawing Sheets

CURRENT SENSOR

The contents of the following Japanese patent applications are incorporated herein by reference:
NO. 2016-237478 filed on Dec. 7, 2016, and
NO. 2017-004691 filed on Jan. 13, 2017.

BACKGROUND

1. Technical Field

The present invention relates to a current sensor.

2 Related Art

A conventional current sensor is known that uses magnetic sensors such as Hall elements and magnetic resistance elements, as shown in Patent Documents 1, 2, and 3, for example.
Patent Document 1: Japanese Patent Application Publication No. 2005-283451
Patent Document 2: International Patent Application Publication No. 2016/056135
Patent Document 3: International Patent Application Publication No. 2015/015539

A current sensor preferably has high sensitivity.

SUMMARY

According to a first aspect of the present invention, provided is a current sensor comprising a sealing portion. The current sensor may comprise a first conductor. The first conductor may include a bent portion bent in a planar view within the sealing portion. The first conductor may include two end portions that are exposed from the sealing portion. The current sensor may comprise a second conductor. The second conductor may include a bent portion bent in the planar view within the sealing portion. The second conductor may include two end portions that are exposed from the sealing portion. The current sensor may comprise a first magnetic sensor. The first magnetic sensor may be provided within the sealing portion and arranged inside the first conductor in the planar view. The current sensor may comprise a second magnetic sensor. The second magnetic sensor may be provided within the sealing portion and arranged inside the second conductor in the planar view. One end portion of the first conductor and one end portion of the second conductor may be electrically connected.

The current sensor may further comprise a connecting portion that electrically connects the one end portion of the first conductor and the one end portion of the second conductor. The first conductor and the second conductor may be electrically connected such that the same current under measurement flows through the first conductor and the second conductor.

The first conductor and the second conductor may be electrically connected such that a magnetic field applied to a position of the first magnetic sensor due to the current under measurement flowing through the first conductor and a magnetic field applied to a position of the second magnetic sensor due to the current under measurement flowing through the second conductor have directions that are opposite of each other.

The current sensor may further comprise a first outer conductor. The first outer conductor may include a bent portion bent in the planar view within the sealing portion. The first outer conductor may include two end portions exposed from the sealing portion. The first outer conductor may have the first conductor and the first magnetic sensor arranged inside the bent portion in the planar view. The current sensor may further comprise a second outer conductor. The second outer conductor may include a bent portion bent in the planar view within the sealing portion. The second outer conductor may include two end portions exposed from the sealing portion. The second outer conductor may have the second conductor and the second magnetic sensor arranged inside the bent portion in the planar view.

The first conductor, the second conductor, the first outer conductor, and the second outer conductor may be electrically connected such that the same current under measurement flows through the first conductor, the second conductor, the first outer conductor, and the second outer conductor.

The first conductor and the first outer conductor may be electrically connected such that a magnetic field applied to a position of the first magnetic sensor due to the current under measurement flowing through the first conductor and a magnetic field applied to a position of the first magnetic sensor due to the current under measurement flowing through the first outer conductor are in the same direction as each other. The second conductor and the second outer conductor may be electrically connected such that a magnetic field applied to a position of the second magnetic sensor due to the current under measurement flowing through the second conductor and a magnetic field applied to a position of the second magnetic sensor due to the current under measurement flowing through the second outer conductor are in the same direction as each other. A first conductor group including the first conductor and the first outer conductor and a second conductor group including the second conductor and the second outer conductor may be electrically connected such that the magnetic field applied to the position of the first magnetic sensor and the magnetic field applied to the position of the second magnetic sensor are in opposite directions of each other.

The first conductor and the second conductor may have shapes that are linearly symmetrical with respect to each other relative to a vertical bisector of a line segment connecting the first magnetic sensor and the second magnetic sensor. The current sensor may further comprise a signal processing circuit that calculates a difference between an output of the first magnetic sensor and an output of the second magnetic sensor.

The signal processing circuit may be arranged at an angle relative to the sealing portion in the planar view. The signal processing circuit may be arranged at an angle of 45° relative to the sealing portion in the planar view. The first magnetic sensor and the second magnetic sensor may be respectively arranged at positions opposite two adjacent sides of the signal processing circuit. A sensor connecting portion may be arranged along each of the two sides of the signal processing circuit. The sensor connecting portion may be used for connecting the signal processing circuit to the first magnetic sensor and the second magnetic sensor The first magnetic sensor and the second magnetic sensor may have rectangular shapes. The first magnetic sensor and the second magnetic sensor may be arranged at an angle relative to the sealing portion in the planar view. Each side of the first magnetic sensor and the second magnetic sensor is arranged parallel to each side of the signal processing circuit in the planar view. The first conductor and the second conductor may be connected in series. The first conductor and the second conductor may be connected in parallel.

The current sensor may comprise a frame portion on which the signal processing circuit is mounted. The current sensor may comprise an insulating member. The insulating member may be secured to a bottom surface of the frame portion. The insulating member may have the first magnetic sensor and the second magnetic sensor mounted thereon. The current sensor may further comprise a first insulating member. The first insulating member may be arranged on the first conductor and the second conductor. The signal processing circuit may be arranged on the first insulating member.

The current sensor may further comprise a lead frame that is provided separated from the first conductor and the second conductor within the sealing portion and includes protruding portions arranged to sandwich the first conductor and the second conductor in the planar view. The current sensor may further comprise a second insulating member adhered to the protruding portions. The first magnetic sensor and the second magnetic sensor may be mounted on the second insulating member. The sealing portion may be formed between the second insulating member and the first conductor and second conductor.

The first magnetic sensor, the second magnetic sensor, and the signal processing circuit may be formed on the same semiconductor substrate. The two end portions of the first conductor and the two end portions of the second conductor may be exposed in the same side surface of the sealing portion. The first semiconductor and the second semiconductor may be U-shaped, V-shaped, or C-shaped in the planar view.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1:
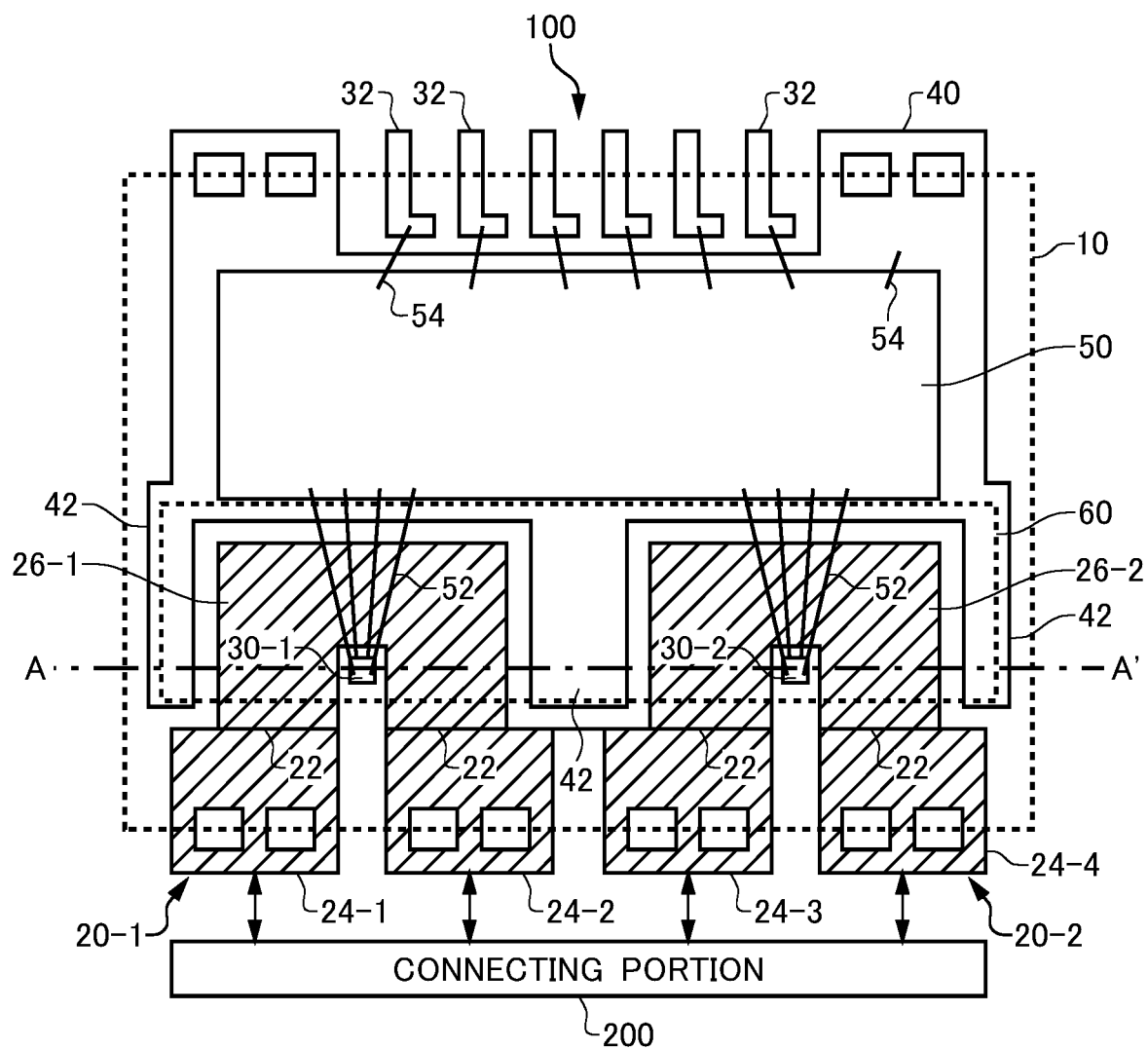
FIG. 1 is a planar view of the outline of a current sensor 100 according to a first embodiment of the present invention.

FIG. 1 is a planar view of the outline of a current sensor 100 according to a first embodiment of the present invention. The current sensor 100 includes a sealing portion 10, a first conductor 20-1, a second conductor 20-2, a first magnetic sensor 30-1, and a second magnetic sensor 30-2. In this Specification, the first conductor 20-1 and second conductor 20-2 are sometimes referred to as conductors 20. Furthermore, the first magnetic sensor 30-1 and the second magnetic sensor 30-2 are sometimes referred to as magnetic sensors 30.

The sealing portion 10 is formed by an insulating material such as resin. The sealing portion 10 may be mold resin. As an example, the sealing portion 10 has a cuboid shape. The sealing portion 10 is formed to cover around the conductors 20 and magnetic sensors 30. However, a portion of each conductor 20 is exposed from the sealing portion 10. Furthermore a portion of each magnetic sensor 30 may be exposed from the sealing portion 10.

Each conductor 20 includes a bent portion 26 that is bent, in a planar view, within the sealing portion 10. The plane of the planar view in the present example refers to a plane that is parallel to the surface having the greatest area among the surfaces of the conductors 20. Each conductor 20 in the present example is board-shaped, and the two main surfaces of this board shape are referred to as the top surface and the bottom surface. FIG. 1 shows the top surfaces of the conductors 20.

The term "bent" is not limited to a curved shape in the planar view. Each bent portion 26 may have a shape obtained by combining one or more curved portion in the planar view, a shape obtained by combining a plurality of straight portions, or a shape obtained by combining one or more curved portions with one or more straight portions. As an example, each bent portion 26 may be U-shaped, V-shaped, or C-shaped in the planar view.

Each conductor 20 has two or more end portions 24. In the present example, each conductor 20 has two end portions 24. Each end portion 24 is exposed from the sealing portion 10. In the present example, each end portion 24 of the two conductors 20 is exposed on the same side surface of the sealing portion 10. At least one end portion 24 may be exposed on a different side surface than the other end portions 24.

The bent portions 26 are provided to surround prescribed regions in the planar view. In the planar view, the regions surrounded by the conductors 20 and the side surfaces of the sealing portion 10 where the end portions of the conductors 20 are exposed are the insides of the bent portion 26. Furthermore, the "inside" of each conductor refers to the region defined by the conductor including the bent portion and the surface of the sealing portion where the conductor is exposed. For example, the inside of each conductor 20 refers to the region defined by the conductor 20 including the bent portion 26 and the side surfaces of the sealing portion 10 where the end portions of the conductor 20 are exposed.

The first magnetic sensor 30-1 is provided within the sealing portion 10, and arranged inside the first conductor 20-1 in the planar view. In the present example, the first magnetic sensor 30-1 is arranged inside the bent portion 26-1 of the first conductor 20-1 in the planar view. The second magnetic sensor 30-2 is provided within the sealing portion 10, and arranged inside the second conductor 20-2 in the planar view. In the present example, the second magnetic sensor 30-2 is arranged inside the bent portion 26-2 of the second conductor 20-2 in the planar view.

The current under measurement that is to be measured by the current sensor 100 flows through the first conductor 20-1 and the second conductor 20-2. The conductors 20 are formed by a conductive material such as metal. One end portion 24 of the first conductor 20-1 and one end portion 24 of the second conductor 20-2 are electrically connected. The first conductor 20-1 and the second conductor 20-2 may be connected in series or in parallel. If the two conductors 20 are connected in series, the same current under measurement flows through each conductor 20. If the two conductors 20 are connected in parallel, a current under measurement distributed according to a resistance ratio flows through each conductor 20.

The connecting portion 200 connects the conductors 20 in series or in parallel. Furthermore, the connecting portion 200 applies the current under measurement to the conductors 20, and receives the current under measurement that has passed through the conductors 20. The connecting portion 200 may be provided in the current sensor 100, or may be provided outside of the current sensor 100. The connecting portion 200 may be a wiring pattern formed by a combination of a lead frame and a bonding wire connected to each conductor 20, or may be a wiring pattern provided on a printed wiring substrate or the like.

With such a configuration, it is possible for the current under measurement to flow through each conductor 20. Therefore, it is possible to detect the current under measurement with each magnetic sensor 30. Accordingly, it becomes easy to increase the accuracy of the detection of the current under measurement.

As an example, the first conductor 20-1 and the second conductor 20-2 are electrically connected such that the magnetic field applied to the position of the first magnetic sensor 30-1 due to the current under measurement flowing through the first conductor 20-1 and the magnetic field applied to the position of the second magnetic sensor 30-2 due to the current under measurement flowing through the second conductor 20-2 are in opposite directions of each other. As a more specific example, the end portion 24-2 of the first conductor 20-1 and the end portion 24-4 of the second conductor 20-2 are electrically connected. Then, the current under measurement is applied to one end portion 24 among the end portion 24-1 of the first conductor 20-1 and the end portion 24-3 of the second conductor 20-2, and the current under measurement is output from the other end portion 24. In this way, the current under measurement flowing around the magnetic sensor 30-1 in the first conductor 20-1 and the current under measurement flowing around the magnetic sensor 30-2 in the second conductor 20-2 have the same magnitude but are in opposite directions of each other.

The output of each magnetic sensor 30 includes a measurement component corresponding to the current under measurement and a noise component corresponding to external noise. When the current under measurement flows in the manner described above, the positive/negative signs of the measurement components included in the outputs of the first magnetic sensor 30-1 and the second magnetic sensor 30-2 are different, while the signs of the noise components are the same. Therefore, by acquiring the difference between the outputs of the first magnetic sensor 30-1 and the second magnetic sensor 30-2, it is possible to increase (double, for example) the sensitivity to the current under measurement, while reducing or eliminating the effect of external noise. Therefore, it is possible to detect the current under measurement with high accuracy.

Each conductor 20 may include stepped portions 22 between the bent portion 26 and the end portions 24. Each stepped portion 22 provides a connection between the bent portion 26 and the end portion 24 if the bent portion 26 and the end portion 24 are provided at different height positions. In the present example, the height direction refers to the direction perpendicular to the plane shown in FIG. 1. Each stepped portion 22 can be formed by applying bending processing, half-blanking processing, etching processing, or the like to a board-shaped conductor.

The current sensor 100 in the present example includes a signal processing chip 50 arranged within the sealing portion 10. The signal processing chip 50 includes a signal processing circuit that processes the output signals of the first magnetic sensor 30-1 and the second magnetic sensor 30-2. The signal processing circuit may be an integrated circuit formed on a semiconductor substrate. As described above, the signal processing chip 50 may calculate the difference between the outputs of the first magnetic sensor 30-1 and the second magnetic sensor 30-2. A processing circuit provided outside of the sealing portion 10 may process the output signals of the first magnetic sensor 30-1 and the second magnetic sensor 30-2.

The current sensor 100 in the present example includes a lead frame 40, one or more lead frames 32, an insulating member 60, wires 52, and wires 54. The insulating member 60 is an example of a second insulating member. The lead frame 40 is formed by a conductive material such as metal, and is provided to be electrically separated from the conductors 20. The material of the lead frame 40 may be the same as the material of the conductors 20. The lead frame 40 may be board-shaped. The lead frame 40 may be provided overlapping with the conductors 20 or not overlapping with the conductors 20, in an overhead view. The lead frame 40 in the example shown in FIG. 1 is provided to not overlap with the conductors 20. Insulation is provided between the lead frame 40 and the conductors 20 by the sealing portion 10. The lead frame 40 includes at least one end portion exposed from the sealing portion 10.

The signal processing chip 50 in the present example is provided on the lead frame 40. The signal processing chip 50 processes the output signals of the magnetic sensors 30, as described above. The signal processing chip 50 may supply a signal or power for driving the magnetic sensors 30. The signal processing chip 50 is electrically connected to each magnetic sensor 30 by the wires 52.

The signal processing chip 50 is electrically connected to the lead frame 40 and the one or more lead frames 32, by the wires 54. The signal processing chip 50 sends and receives power and signals to and from an external circuit, via the lead frame 40 and the lead frames 32. The lead frame 40 may have a ground potential applied thereto.

At least a portion of the insulating member 60 in the overhead view is arranged inside each conductor 20. The insulating member 60 in the present example is shaped as a sheet. As an example, the insulating member 60 is a polyimide sheet. The magnetic sensors 30 are arranged on the top surface of the insulating member 60 provided inside the conductors 20. In this way, the magnetic sensors 30 are supported.

The lead frame 40 in the present example includes protruding portions 42 that are arranged to sandwich the bent portion 26 of each conductor 20, in the overhead view. The lead frame 40 may include a protruding portion 42 between the first conductor 20-1 and the second conductor 20-2 as well. The insulating member 60 is adhered to the bottom surface of the two or more protruding portions 42 of the lead frame 40, and provided to span across the two or more protruding portions 42.

Figure 2:
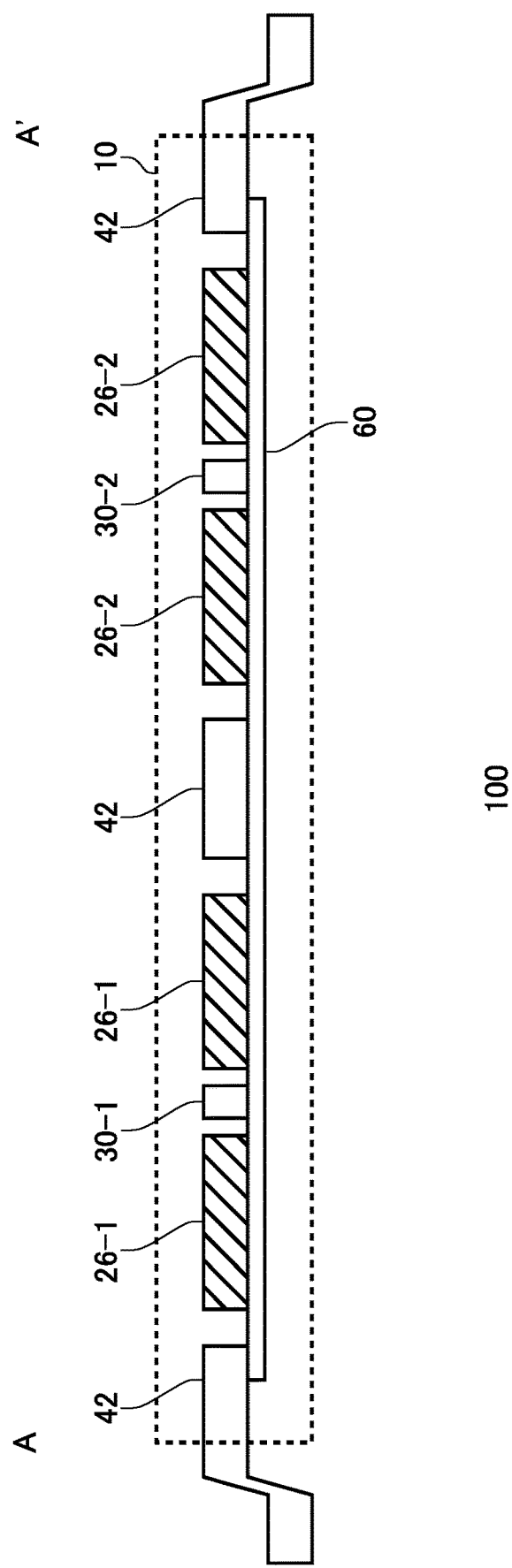
FIG. 2 is an exemplary side view in a case where the current sensor 100 in FIG. 1 is cleaved on the line A-A'.

FIG. 2 is an exemplary side view in a case where the current sensor 100 in FIG. 1 is cleaved on the line A-A'. The insulating member 60 in the present example is adhered to the bottom surfaces of the protruding portions 42 of the lead frame 40 and the bottom surfaces of the bent portions 26 of the conductors 20. The protruding portions 42 and the bent portions 26 in the present example have bottom surfaces with portions that have the same height. A portion of the insulating member 60 includes portions that are not covered by the conductors 20, inside the conductors 20. The magnetic sensors 30 are mounted on the top surface of the insulating member 60 at these portions.

With such a configuration, the magnetically sensitive surfaces of the magnetic sensors 30 can be arranged at approximately the same height as the conductors 20 or a lower height than the conductors 20. Therefore, it is possible to improve the S/N ratio of the magnetic sensors 30. Furthermore, the magnetic sensors 30 can be supported by the insulating member 60.

Figure 3:
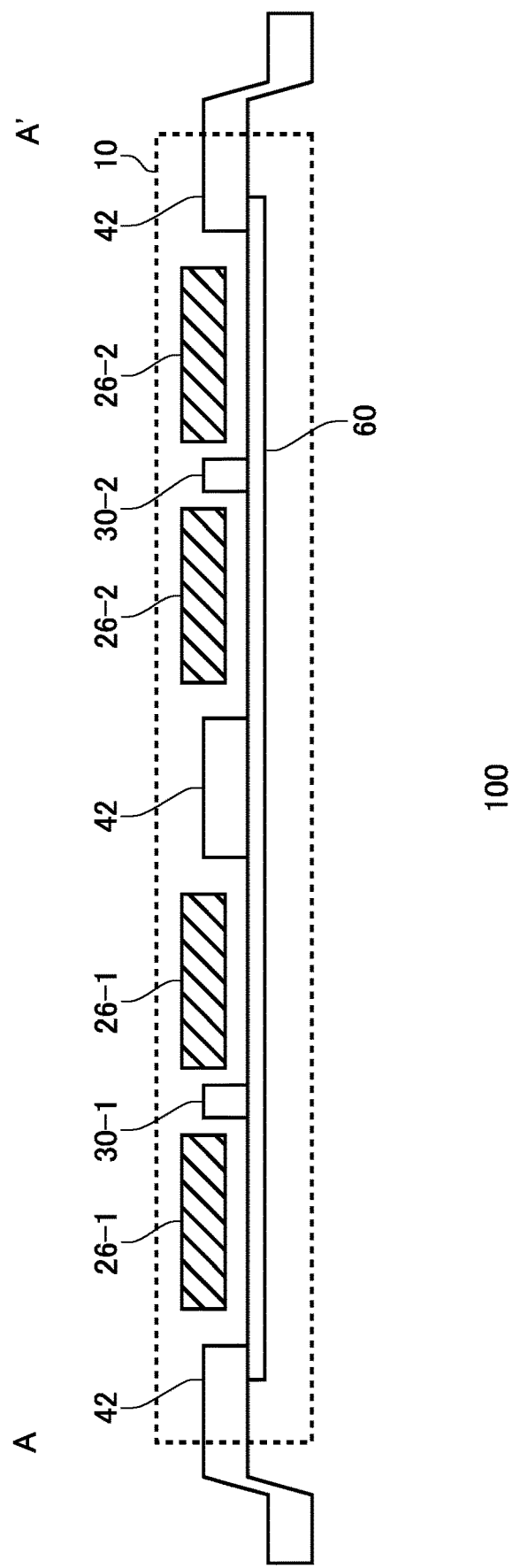
FIG. 3 is another exemplary side view in a case where the current sensor 100 in FIG. 1 is cleaved on the line A-A'.

FIG. 3 is another exemplary side view in a case where the current sensor 100 in FIG. 1 is cleaved on the line A-A'. The insulating member 60 in the present example is adhered to the bottom surfaces of the protruding portions 42 of the lead frame 40, but is not adhered to the bottom surfaces of the bent portions 26 of the conductors 20. The bottom surfaces of the bent portions 26 in the present example are arranged at positions higher than the bottom surfaces of the protruding portions 42. The portions of the end portions 24 of the conductors 20 positioned within the sealing portion 10 may be arranged at the same height as the protruding portions 42. In this case, the conductors 20 include the stepped portions 22 shown in FIG. 1 between the end portions 24 and the bent portions 26.

A portion of the insulating member 60 includes portions that are not covered by the conductors 20, inside the conductors 20. The magnetic sensors 30 are mounted on the top surfaces of these portions of the insulating member 60. The magnetic sensors 30 can be supported by the insulating member 60.

By including the stepped portions 22, the space between the insulating member 60 and the bent portions 26 of the conductors 20 is filled with the resin of the sealing portion 10, and therefore the conductors 20 and the lead frame 40 are not connected by the insulating member 60. As a result, a creepage surface caused by the insulating member 60 is not formed between the conductors 20 and the lead frame 40, and therefore it is possible to improve the withstand voltage between the conductors 20 and the lead frame 40.

The bent portions 26 are preferably provided such that the magnetically sensitive surfaces of the magnetic sensors 30 are arranged between the top surfaces and bottom surfaces of the bent portions 26. In the present example, the magnetically sensitive surfaces of the magnetic sensors 30 are the top surfaces of the magnetic sensors 30. With the configuration that includes the stepped portions 22, it is possible to bring the magnetically sensitive surfaces of the magnetic sensors 30 closer to the center between the top surfaces and the bottom surfaces of the bent portions 26 of the conductors 20, without reducing the thickness of the magnetic sensors 30. In this way, it is possible to improve the S/N ratio of the magnetic sensors 30. The magnetically sensitive surfaces of the magnetic sensors 30 may be arranged in the center between the top surfaces and the bottom surfaces of the bent portions 26. In this case, the magnetic sensors 30 may be Hall elements. The center between the top surface and the bottom surface of a bent portion 26 may include an error range that is approximately 10% of the thickness of the bent portion 26 in the height direction.

Figure 4:
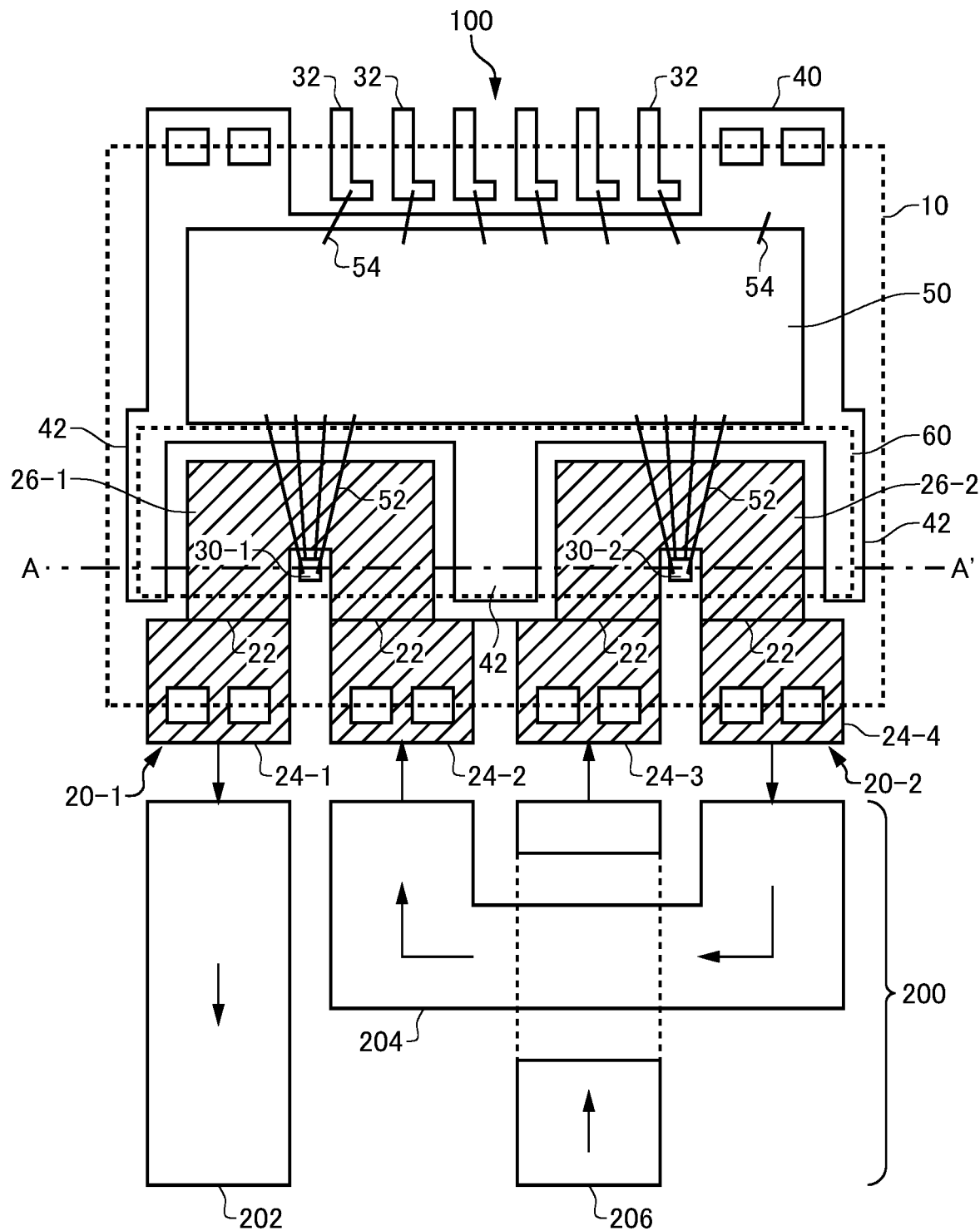
FIG. 4 shows an exemplary connecting portion 200.

FIG. 4 shows an exemplary connecting portion 200. The connecting portion 200 in the present example includes wiring 202, wiring 204, and wiring 206. Each portion where wiring intersects with other wiring may be arranged at a different height than the other portions. As an example, different layers of a multilayer wiring substrate may be used. In the example of FIG. 4, portions arranged at different heights (layers) are indicated by dashed lines.

The wiring 204 connects the end portion 24-2 of the first conductor 20-1 to the end portion 24-4 of the second conductor 20-2. The wiring 202 is connected to the end portion 24-1 of the first conductor 20-1. The wiring 206 is connected to the end portion 24-3 of the second conductor 20-2. With such a configuration, the wiring 206, the second conductor 20-2, the wiring 204, the first conductor 20-1, and the wiring 202 are connected in series in the stated order. By applying the current under measurement from one of the wiring 202 and the wiring 206 and receiving the current under measurement with the other wiring, the same current under measurement can be made to flow to the first conductor 20-1 and the second conductor 20-2. In FIG. 4, the direction in which the current under measurement flows is indicated by arrow marks.

Furthermore, with such a configuration, the magnetic field applied to the position of the first magnetic sensor 30-1 due to the current under measurement flowing through the first conductor 20-1 and the magnetic field applied to the position of the second magnetic sensor 30-2 due to the current under measurement flowing through the second conductor 20-2 are in opposite directions of each other. In the example of FIG. 4, the current under measurement in the first conductor 20-1 flows in a counter-clockwise direction around the first magnetic sensor 30-1 in the overhead view, and the current under measurement in the second conductor 20-2 flows in a clockwise direction around the second magnetic sensor 30-2 in the overhead view. As described above, by calculating the difference between the outputs of the respective magnetic sensors 30, it is possible to restrict the effect of external noise and detect the current under measurement with high accuracy. Furthermore, even when the current under measurement is small, the measurement components detected by the plurality of magnetic sensors 30 are added together because the first conductor 20-1 and the second conductor 20-2 are connected in series via the wirings 202, 204, and 206, and therefore the current under measurement can be detected with high accuracy.

The first conductor 20-1 and the second conductor 20-2 may have shapes that are linearly symmetrical with respect to each other relative to the vertical bisector of a line segment connecting the first magnetic sensor 30-1 and the second magnetic sensor 30-2. Instead, the first conductor 20-1 and the second conductor 20-2 may have shapes that are linearly symmetrical with respect to each other relative to a line segment passing between the center of the signal processing circuit and the first conductor 20-1 and second conductor 20-2. The center of the signal processing circuit may be the center of the signal processing chip 50 including the signal processing circuit in the planar view. The first conductor 20-1 and the second conductor 20-2 may have the same shape. Portions of the first conductor 20-1 and the second conductor 20-2 arranged within the sealing portion 10 may have the same shape. Furthermore, the relative position of the first magnetic sensor 30-1 with respect to the first conductor 20-1 and the relative position of the second magnetic sensor 30-2 with respect to the second conductor 20-2 may be the same. In this way, the measurement components detected by the first magnetic sensor 30-1 and the second magnetic sensor 30-2 can be made equivalent.

Figure 5:
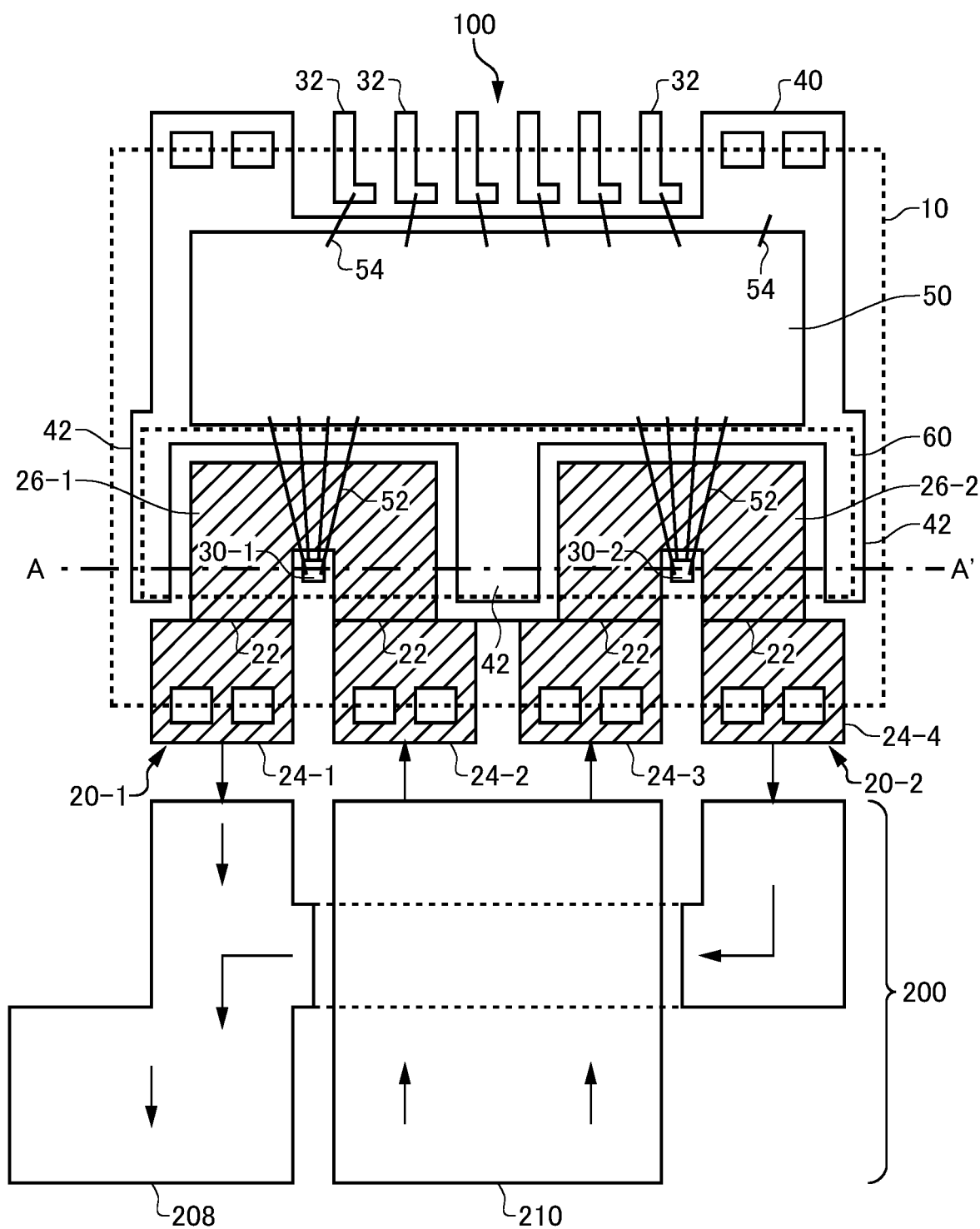
FIG. 5 shows another exemplary connecting portion 200.

FIG. 5 shows another exemplary connecting portion 200. The connecting portion 200 in the present example includes wiring 208 and wiring 210. The wirings are provided at a distance from each other.

The wiring 208 connects the end portion 24-1 of the first conductor 20-1 to the end portion 24-4 of the second conductor 20-2. The wiring 210 connects the end portion 24-2 of the first conductor 20-1 to the end portion 24-3 of the second conductor 20-2. With such a configuration, the first conductor 20-1 and the second conductor 20-2 are connected in parallel between the wiring 208 and the wiring 210. By applying the current under measurement from one of the wiring 208 and the wiring 210 and receiving the current under measurement with the other wiring, the current under measurement can be distributed to flow to the first conductor 20-1 and the second conductor 20-2 in a shared manner.

Furthermore, with such a configuration, the magnetic field applied to the position of the first magnetic sensor 30-1 due to the current under measurement flowing through the first conductor 20-1 and the magnetic field applied to the position of the second magnetic sensor 30-2 due to the current under measurement flowing through the second conductor 20-2 are in opposite directions of each other. As described above, by calculating the difference between the outputs of the magnetic sensors 30, it is possible to restrict the effect of external noise and detect the current under measurement with high accuracy. Furthermore, since the current under measurement is distributed in a shared manner and measured, it is possible to reduce the heat generation per set of a magnetic sensor 30 and a conductor 20, and this is particularly favorable in a case where the current under measurement is large. The amount of current flowing through the first conductor 20-1 and the amount of current flowing through the second conductor 20-2 may be the same or may be different. The connecting portion 200 may be capable of switching whether the first conductor 20-1 and the second conductor 20-2 are connected in series or connected in parallel. As an example, the connecting portion 200 may be capable of this switching via a jumper, switch, relay, or the like.

Second Embodiment

Figure 6:
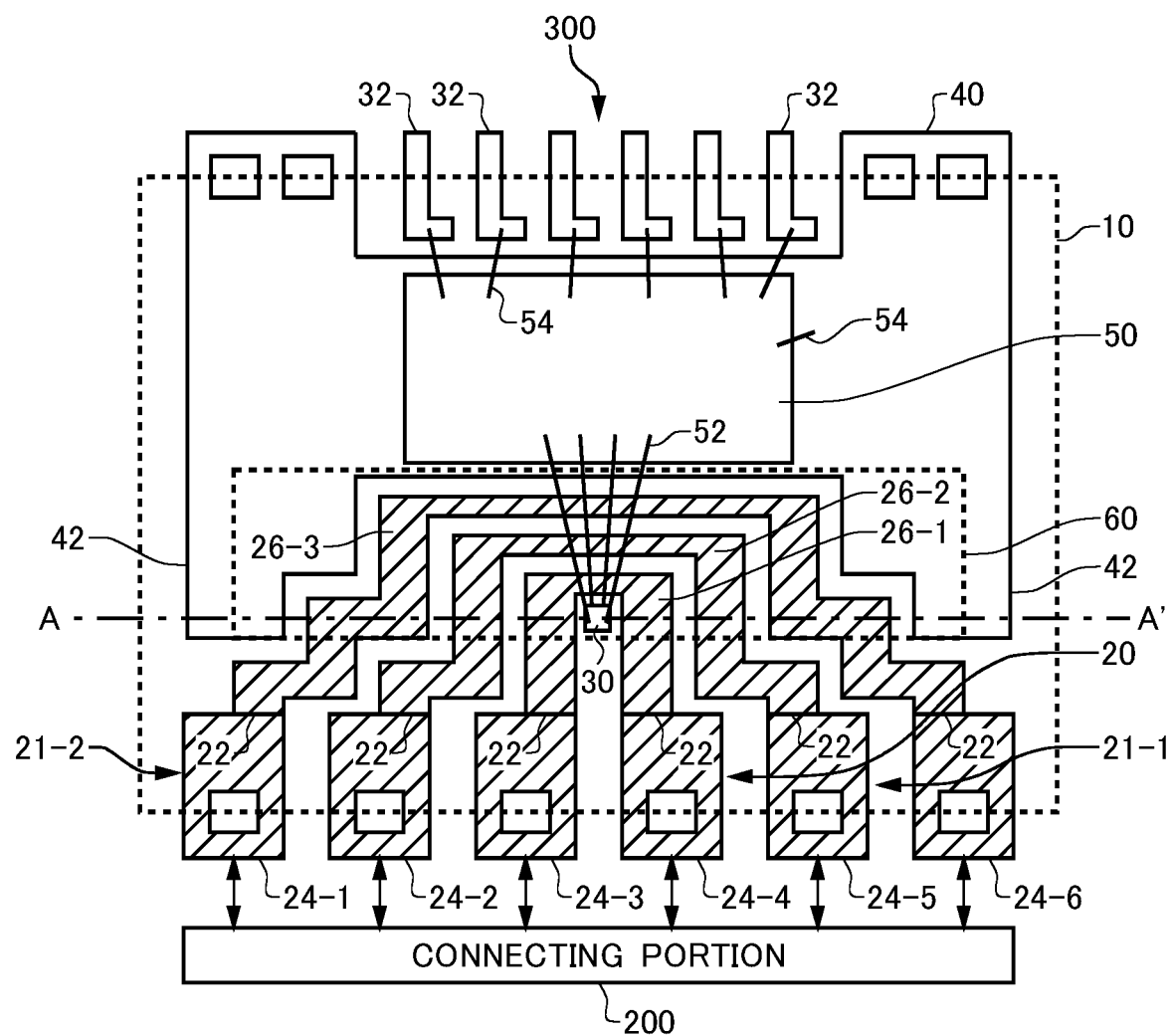
FIG. 6 is a planar view of a current sensor 300 according to a second embodiment of the present invention.

FIG. 6 is a planar view of a current sensor 300 according to a second embodiment of the present invention. The current sensor 300 differs from the current sensor 100 with regard to the configurations of the conductors 20 and the magnetic sensors 30. The remaining configuration may be the same as that of the current sensor 100.

The current sensor 300 includes one magnetic sensor 30, one conductor 20, and one or more outer conductors 21. The current sensor 300 in the present example includes an outer conductor 21-1 and an outer conductor 21-2. The number of outer conductors 21 may be one, or may be three or more. The conductor 20 and the outer conductors 21 each include a bent portion 26 and two end portions 24. The conductor 20 and the outer conductors 21 may each include a stepped portion 22. The structures of the bent portion 26, the end portions 24, and the stepped portions 22 may be the same as the structures of the bent portions 26, the end portions 24, and the stepped portions 22 in the conductors 20 of the current sensor 100.

The outer conductor 21-2 includes a bent portion 26-3 that is bent in the planar view within the sealing portion 10, and the two end portions 24 thereof are exposed from the sealing portion 10. The outer conductor 21-1 includes a bent portion 26-2 that is bent in the planar view within the sealing portion 10, the two end portions 24 thereof are exposed from the sealing portion 10, and the outer conductor 21-1 is arranged inside the bent portion 26-3 of the outer conductor 21-2 in the planar view.

The conductor 20 includes a bent portion 26-1 that is bent in the planar view within the sealing portion 10, the two end portions 24 thereof are exposed from the sealing portion 10, and the conductor 20 is arranged inside the bent portion 26-2 of the outer conductor 21-1 in the planar view. The magnetic sensor 30 is provided within the sealing portion 10, and is arranged inside the bent portion 26-1 of the conductor 20 in the planar view. The conductor 20 and the magnetic sensor 30 have structures similar to those of the first conductor 20-1 and the first magnetic sensor 30-1 in the current sensor 100.

The connecting portion 200 connects the conductor 20 to each outer conductor 21, such that the same current under measurement flows to the conductor 20 and each outer conductor 21. In other words, the connecting portion 200 connects the conductor 20 and each outer conductor 21 in series.

The connecting portion 200 electrically connects one end portion 24 of the conductor 20 to one end portion 24 of the outer conductor 21-1. The connecting portion 200 electrically connects the conductor 20 to the outer conductor 21-1 such that the magnetic field applied to the position of the magnetic sensor 30 due to the current under measurement flowing through the conductor 20 and the magnetic field applied to the position of the magnetic sensor 30 due to the current under measurement flowing through the outer conductor 21-1 are in the same direction as each other. In other words, the connecting portion 200 connects the conductor 20 to the outer conductor 21-1 such that the direction in which the current under measurement flowing through the conductor 20 moves around the magnetic sensor 30 in the planar view is the same as the direction in which the current under measurement flowing through the outer conductor 21-1 moves around the magnetic sensor 30 in the planar view.

The connecting portion 200 electrically connects one end portion 24 of the outer conductor 21-1 to one end portion 24 of the outer conductor 21-2. The connecting portion 200 electrically connects the outer conductor 21-1 to the outer conductor 21-2 such that the magnetic field applied to the position of the magnetic sensor 30 due to the current under measurement flowing through the outer conductor 21-1 and the magnetic field applied to the position of the magnetic sensor 30 due to the current under measurement flowing through the outer conductor 21-2 are in the same direction as each other. In other words, the connecting portion 200 connects the outer conductor 21-1 to the outer conductor 21-2 such that the direction in which the current under measurement flowing through the outer conductor 21-1 moves around the magnetic sensor 30 in the planar view is the same as the direction in which the current under measurement flowing through the outer conductor 21-2 moves around the magnetic sensor 30 in the planar view.

With such a configuration, the magnetic fields generated by the current under measurement flowing respectively through the conductor 20 and the one or more outer conductors 21 are added together, and applied to the position of the magnetic sensor 30. Therefore, it is possible to perform detection with high accuracy even when the current under measurement is small.

Figure 7:
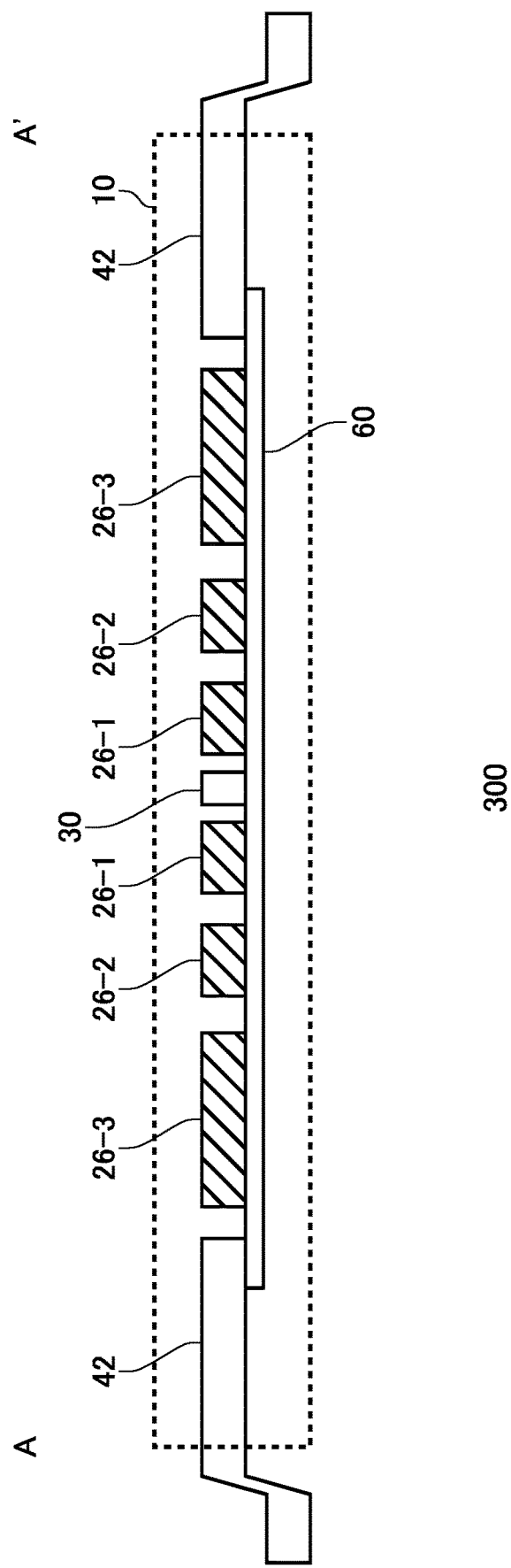
FIG. 7 is an exemplary side view in a case where the current sensor 300 in FIG. 6 is cleaved on the line A-A'.

FIG. 7 is an exemplary side view in a case where the current sensor 300 in FIG. 6 is cleaved on the line A-A'. The insulating member 60 in the present example is adhered to the bottom surfaces of the protruding portions 42 of the lead frame 40 and the bottom surfaces of the bent portions 26 of the conductor 20 and the outer conductors 21, in the same manner as in the example of FIG. 2. The protruding portions 42 and the bent portion 26 in the present example have bottom surfaces with portions that have the same height. A portion of the insulating member 60 includes portions that are not covered by the conductor 20 inside the conductor 20. The magnetic sensor 30 is mounted on the top surface of the insulating member 60 at this portion.

With such a configuration, the magnetically sensitive surface of the magnetic sensor 30 can be arranged at approximately the same height as the conductor 20 or a lower height than the conductor 20. Therefore, it is possible to improve the S/N ratio of the magnetic sensor 30. Furthermore, the magnetic sensors 30 can be supported by the insulating member 60.

Figure 8:
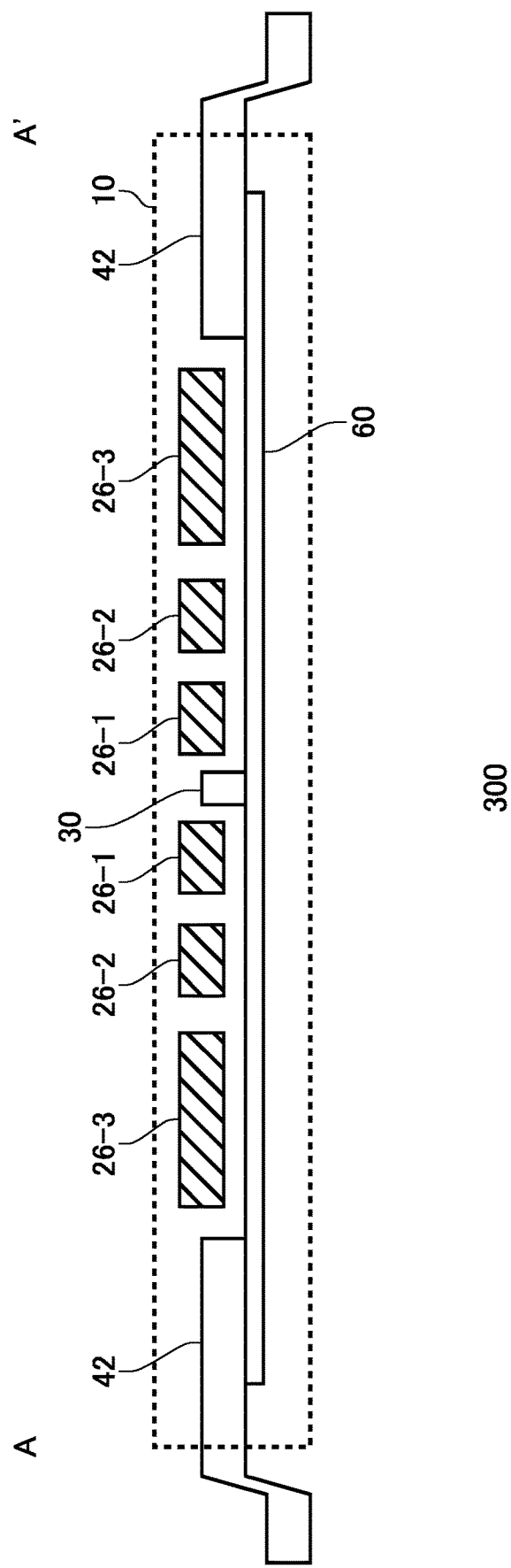
FIG. 8 is another exemplary side view in a case where the current sensor 300 in FIG. 6 is cleaved on the line A-A'.

FIG. 8 is another exemplary side view in a case where the current sensor 300 in FIG. 6 is cleaved on the line A-A'. The insulating member 60 in the present example is adhered to the bottom surfaces of the protruding portions 42 of the lead frame 40, but is not adhered to the bottom surfaces of the bent portions 26 of the conductor 20 and the outer conductors 21, in the same manner as in the example of FIG. 3. The bottom surfaces of the bent portions 26 in the present example are arranged at positions higher than the bottom surfaces of the protruding portions 42. The conductor 20 and the outer conductors 21 in the present example include the stepped portions 22 shown in FIG. 6 between the end portions 24 and the bent portions 26.

A portion of the insulating member 60 includes portions that are not covered by the conductor 20, inside the conductor 20. The magnetic sensor 30 is mounted on the top surface of this portion of the insulating member 60. The magnetic sensor 30 can be supported by the insulating member 60.

By including the stepped portions 22, the space between the insulating member 60 and each bent portion 26 is filled with the resin of the sealing portion 10, and therefore the conductor 20 and outer conductors 21 are not connected to the lead frame 40 by the insulating member 60. As a result, a creepage surface caused by the insulating member 60 is not formed between the conductor 20 and outer conductors 21 and the lead frame 40, and therefore it is possible to improve the withstand voltage between the conductor 20 and outer conductors 21 and the lead frame 40.

Each bent portion 26 is preferably provided such that the magnetically sensitive surface of the magnetic sensor 30 is arranged between the top surface and the bottom surface of the bent portion 26. The height of each bent portion 26 is preferably the same. The magnetically sensitive surface of the magnetic sensor 30 may be arranged in the center between the top surfaces and the bottom surfaces of the bent portions 26.

Figure 9:
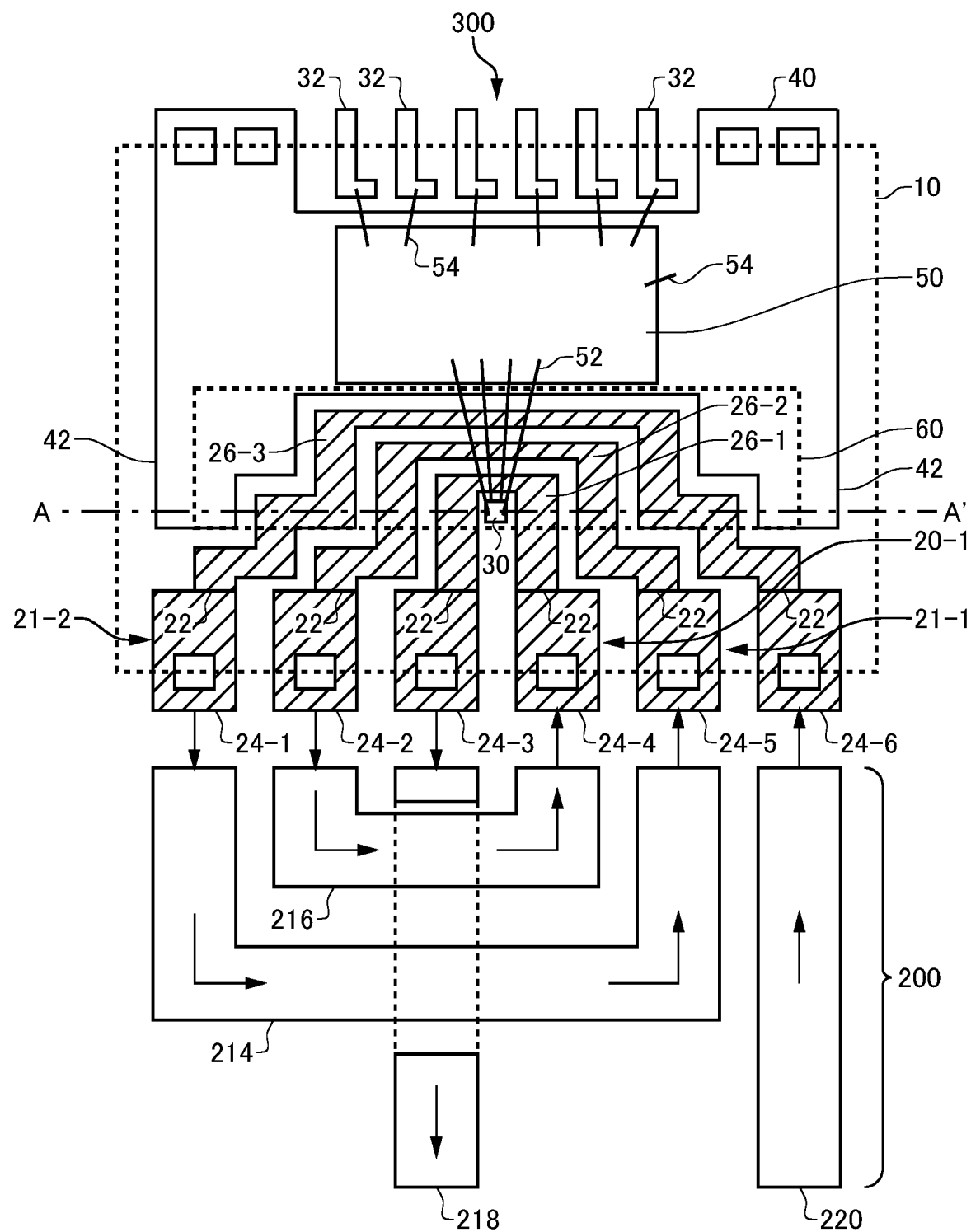
FIG. 9 shows an example of the connecting portion 200 in FIG. 6.

FIG. 9 shows an example of the connecting portion 200 in FIG. 6. The connecting portion 200 in the present example includes wiring 214, wiring 216, wiring 218, and wiring 220. Each portion where wiring intersects with other wiring may be arranged at a different height than the other portions. As an example, different layers of a multilayer wiring substrate may be used.

The wiring 218 is connected to the end portion 24-3 of the conductor 20. The wiring 216 connects the end portion 24-4 of the conductor 20 to the end portion 24-2 of the outer conductor 21-1. The wiring 214 connects the end portion 24-5 of the outer conductor 21-1 to the end portion 24-1 of the outer conductor 21-2. The wiring 220 is connected to the end portion 24-6 of the outer conductor 21-2. With such a configuration, the wiring 220, the outer conductor 21-2, the wiring 214, the outer conductor 21-1, the wiring 216, the conductor 20, and the wiring 218 are connected in series in the stated order. By applying the current under measurement from one of the wiring 220 and the wiring 218 and receiving the current under measurement with the other wiring, the same current under measurement can be made to flow to the conductor 20, the outer conductor 21-1, and the outer conductor 21-2.

Furthermore, with such a configuration, the magnetic field applied to the position of the magnetic sensor 30 by the current under measurement flowing through the conductor 20, the magnetic field applied to the position of the magnetic sensor 30 by the current under measurement flowing through the outer conductor 21-1, and the magnetic field applied to the position of the magnetic sensor 30 by the current under measurement flowing through the outer conductor 21-2 are all in the same direction. In the example of FIG. 9, the current under measurement flows in a counter-clockwise direction around the magnetic sensor 30 in the overhead view, in the conductor 20, the outer conductor 21-1, and the outer conductor 21-2. In this way, it is possible to amplify the magnetic field applied to the position of the magnetic sensor 30, according to the current under measurement.

Third Embodiment

Figure 10:
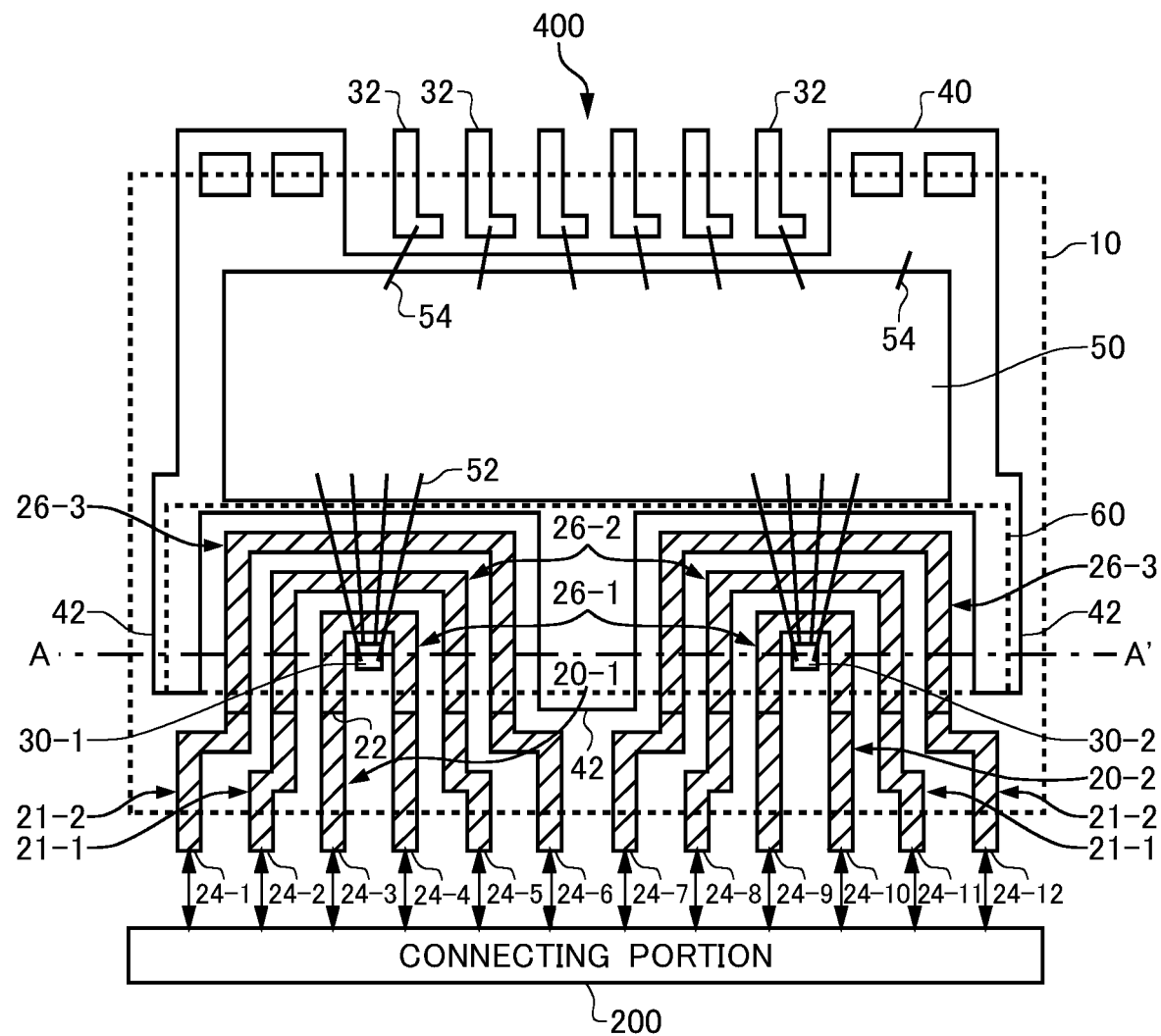
FIG. 10 is a planar view of a current sensor 400 according to a third embodiment of the present invention.

FIG. 10 is a planar view of a current sensor 400 according to a third embodiment of the present invention. The current sensor 400 includes the first conductor 20-1, the second conductor 20-2, the first magnetic sensor 30-1, and the second magnetic sensor 30-2, in the same manner as the current sensor 100. Furthermore, the current sensor 400 includes one or more outer conductors 21 for each conductor 20, in the same manner as the current sensor 300. The remaining configuration may be the same as that of the current sensor 100.

The current sensor 400 in the present example includes an outer conductor 21-1 and an outer conductor 21-2 for each conductor 20. The number of outer conductors 21 provided for a single conductor 20 may be one, or may be three or more. The structures of the conductors 20 and the outer conductors 21 are similar to those of the conductor 20 and the outer conductors 21 in the current sensor 300. In this Specification, the outer conductors 21 corresponding to the first conductor 20-1 are sometimes referred to as the first outer conductors 21, and the outer conductors 21 corresponding to the second conductor 20-2 are sometimes referred to as the second outer conductors 21.

The first outer conductor 21-1 is arranged inside the bent portion 26-3 of the first outer conductor 21-2. The first conductor 20-1 and the first magnetic sensor 30-1 are arranged inside the bent portion 26-2 of the first outer conductor 21-1. The second outer conductor 21-1 is arranged inside the bent portion 26-3 of the second outer conductor 21-2. The second conductor 20-2 and the second magnetic sensor 30-2 are arranged inside the bent portion 26-2 of the second outer conductor 21-1.

The connecting portion 200 connects each conductor 20 to each outer conductor 21. The connecting portion 200 in the present example connects the first conductor 20-1, the first outer conductor 21-1, and the first outer conductor 21-2, in the same manner as the conductor 20, the outer conductor 21-1 and the outer conductor 21-2 shown in FIG. 6. In other words, these conductors are connected in series. Furthermore, the connecting portion 200 connects the second conductor 20-2, the second outer conductor 21-1, and the second outer conductor 21-2 in the same manner as the conductor 20, the outer conductor 21-1, and the outer conductor 21-2 shown in FIG. 6. In other words, these conductors are connected in series.

The connecting portion 200 connects the first conductor 20-1, the first outer conductor 21-1, and the first outer conductor 21-2 such that the directions of the magnetic fields applied to the position of the first magnetic sensor 30-1 due to the currents under measurement flowing respectively through the first conductor 20-1, the first outer conductor 21-1, and the first outer conductor 21-2 are all the same. Similarly, the connecting portion 200 connects the second conductor 20-2, the second outer conductor 21-1, and the second outer conductor 21-2 such that the directions of the magnetic fields applied to the position of the second magnetic sensor 30-2 due to the currents under measurement flowing respectively through the second conductor 20-2, the second outer conductor 21-1, and the second outer conductor 21-2 are all the same.

Furthermore, the connecting portion 200 may connect, in series or in parallel, a first conductor group including the first conductor 20-1, the first outer conductor 21-1, and the first outer conductor 21-2 and a second conductor group including the second conductor 20-2, the second outer conductor 21-1, and the second outer conductor 21-2. If the first conductor group and the second conductor group are connected in series, the same current under measurement flows through the first conductor 20-1, the first outer conductor 21-1, the first outer conductor 21-2, the second conductor 20-2, the second outer conductor 21-1, and the second outer conductor 21-2. Furthermore, the connecting portion 200 connects the first conductor group and the second conductor group such that the magnetic field applied to the position of the first magnetic sensor 30-1 due to the current under measurement flowing through the first conductor 20-1 and the magnetic field applied to the position of the second magnetic sensor 30-2 due to the current under measurement flowing through the second conductor 20-2 have directions that are opposite each other.

With such a configuration, it is possible to restrict the effect of outside noise and accurately detect the current under measurement. Furthermore, by using the outer conductors 21, it is possible to improve the S/N ratio of each magnetic sensor 30. Yet further, by calculating the difference between the outputs of two magnetic sensors 30, it is possible to further improve the sensitivity.

Figure 11:
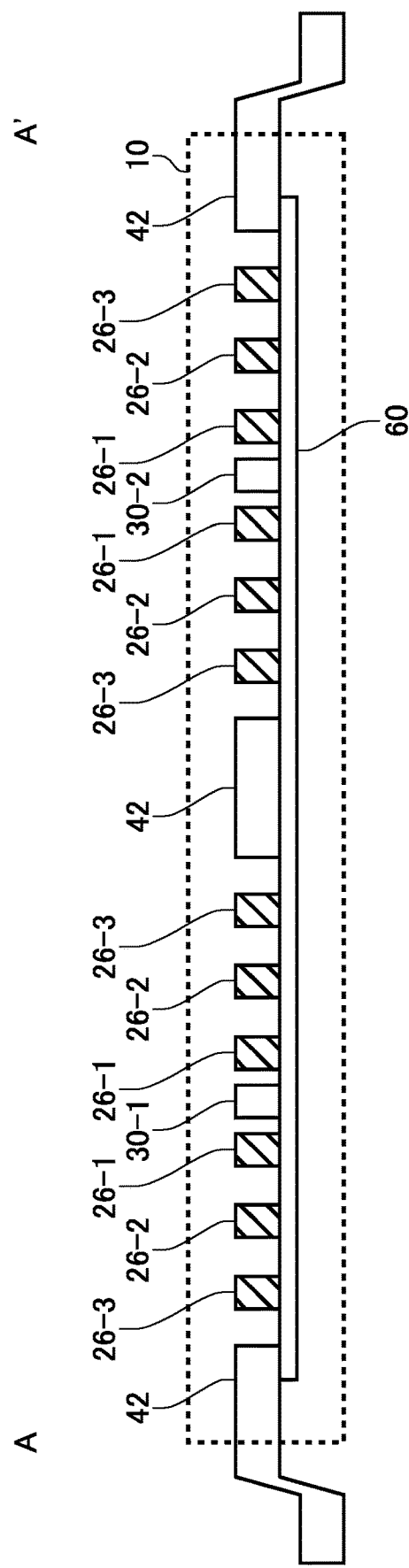
FIG. 11 is an exemplary side view in a case where the current sensor 400 in FIG. 10 is cleaved on the line A-A'.

FIG. 11 is an exemplary side view in a case where the current sensor 400 in FIG. 10 is cleaved on the line A-A'. In the same manner as the example shown in FIG. 2, the insulating member 60 in the present example is adhered to the bottom surfaces of the protruding portions 42 of the lead frame 40 and the bottom surfaces of each of the bent portions 26 of the conductors 20 and the outer conductors 21. The protruding portions 42 and the bent portions 26 in the present example have bottom surfaces with portions that have the same height. A portion of the insulating member 60 includes portions that are not covered by the conductors 20, inside the conductors 20. The magnetic sensors 30 are mounted on the top surface of the insulating member 60 at these portions.

The structure of the current sensor 400 in the present example is the same as that of the current sensor 300 shown in FIG. 7, except that the current sensor 400 includes two conductor groups that each have a conductor 20 and outer conductors 21 and also includes a protruding portion 42 between the conductor groups. With such a configuration, the magnetically sensitive surfaces of the magnetic sensors 30 can be arranged at approximately the same height as the conductors 20 or a lower height than the conductors 20. Therefore, it is possible to improve the S/N ratio of the magnetic sensors 30. Furthermore, the magnetic sensors 30 can be supported by the insulating member 60.

Figure 12:
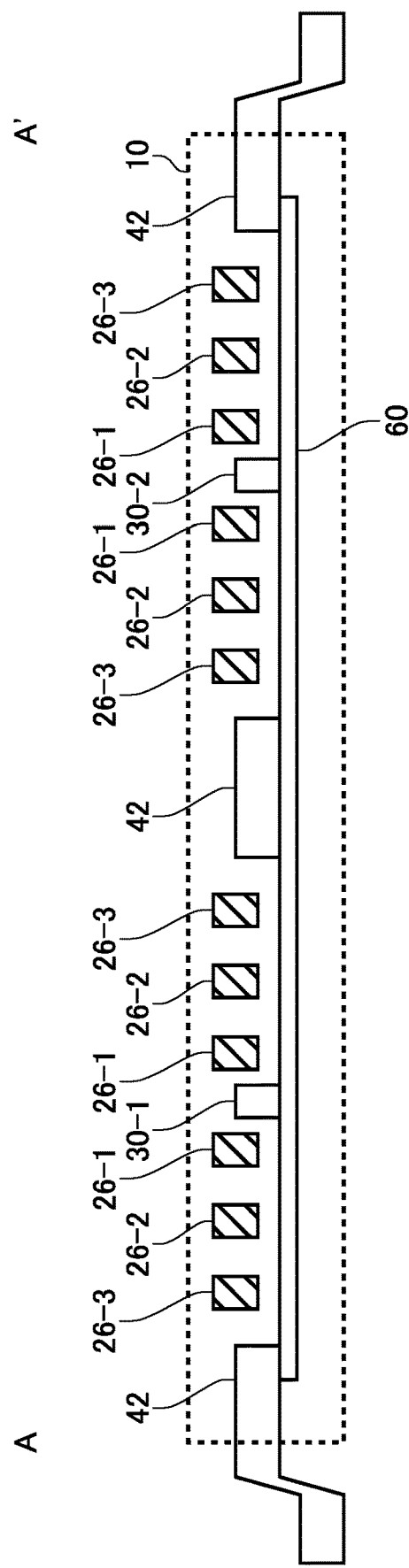
FIG. 12 is another exemplary side view in a case where the current sensor 400 in FIG. 10 is cleaved on the line A-A'.

FIG. 12 is another exemplary side view in a case where the current sensor 400 in FIG. 10 is cleaved on the line A-A'. The insulating member 60 in the present example is adhered to the bottom surfaces of the protruding portions 42 of the lead frame 40, but is not adhered to the bottom surfaces of the bent portions 26 of the conductors 20 and outer conductors 21, in the same manner as the example shown in FIG. 3. The bottom surfaces of the bent portions 26 in the present example are arranged at positions higher than the bottom surfaces of the protruding portions 42. The conductors 20 and outer conductors 21 in the present example include the stepped portions 22 shown in FIG. 10, between the end portions 24 and the bent portions 26.

The structure of the current sensor 400 in the present example is the same as that of the current sensor 300 shown in FIG. 8, except that the current sensor 400 includes two conductor groups that each have a conductor 20 and outer conductors 21 and also includes a protruding portion 42 between the conductor groups. With the structure of the present example, it is possible to improve the S/N ratio of the current sensor 400.

Figure 13:
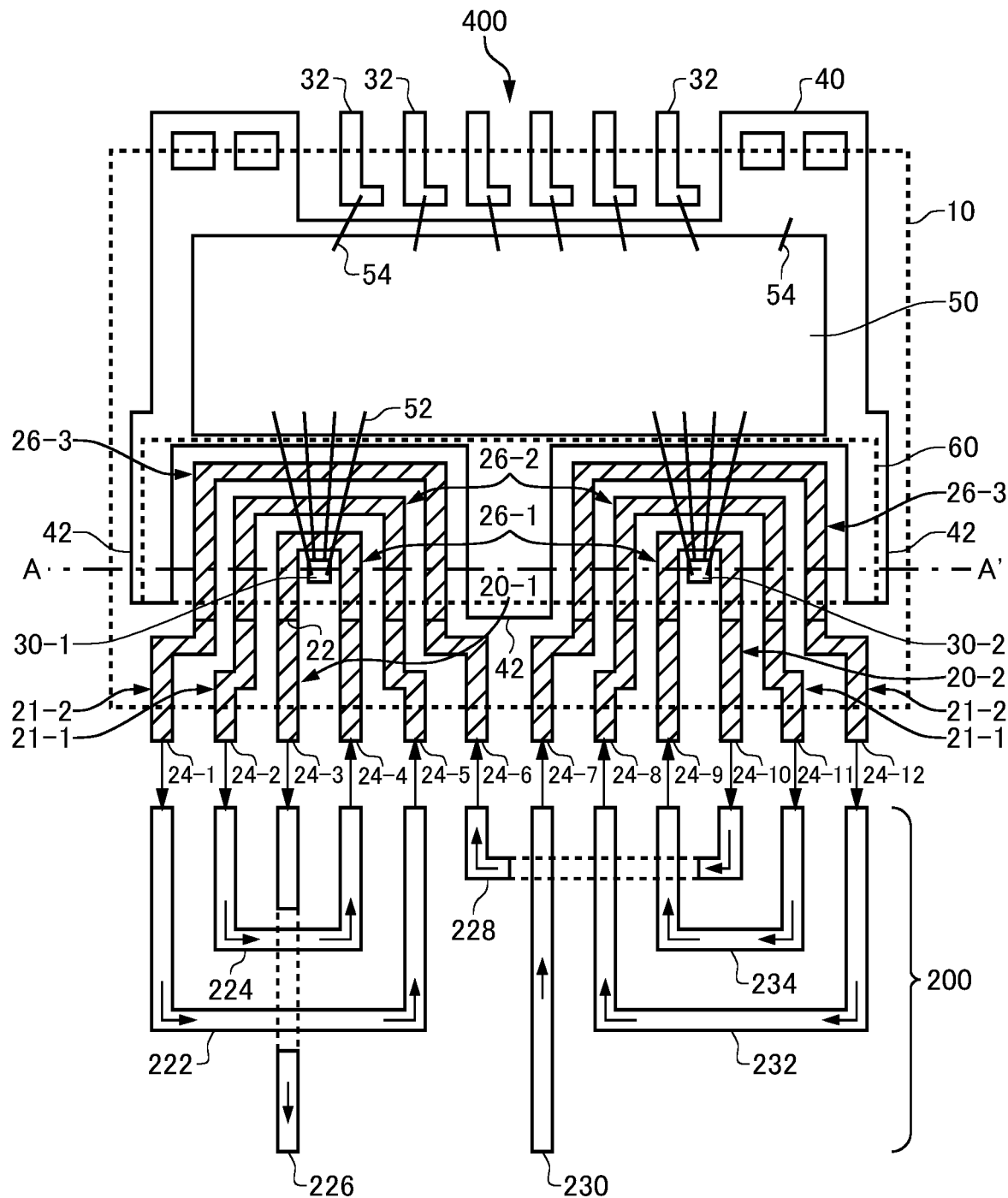
FIG. 13 shows an example of the connecting portion 200 of FIG. 10.

FIG. 13 shows an example of the connecting portion 200 of FIG. 10. The connecting portion 200 includes wiring 222, wiring 224, wiring 226, wiring 228, wiring 230, wiring 232, and wiring 234. Each portion where wiring intersects with other wiring may be arranged at a different height than the other portions. As an example, different layers of a multi-layer wiring substrate may be used.

The wiring 230 is connected to the end portion 24-7 of the second outer conductor 21-2. The wiring 232 connects the end portion 24-12 of the second outer conductor 21-2 to the end portion 24-8 of the second outer conductor 21-1. The wiring 234 connects the end portion 24-11 of the second outer conductor 21-1 to the end portion 24-9 of the second conductor 20-2. The wiring 228 connects the end portion 24-10 of the second conductor 20-2 to the end portion 24-6 of the first outer conductor 21-2.

The wiring 222 connects the end portion 24-1 of the first outer conductor 21-2 to the end portion 24-5 of the first outer conductor 21-1. The wiring 224 connects the end portion 24-2 of the first outer conductor 21-1 to the end portion 24-4 of the first conductor 20-1. The wiring 226 is connected to the end portion 24-3 of the first conductor 20-1. With such a configuration, the wiring 230, the second outer conductor 21-2, the wiring 232, the second outer conductor 21-1, the wiring 234, the second conductor 20-2, the wiring 228, the first outer conductor 21-2, the wiring 222, the first outer conductor 21-1, the wiring 224, the first conductor 20-1, and the wiring 226 are connected in series in the stated order. By applying the current under measurement to one of the wiring 226 and the wiring 230 and receiving the current under measurement with the other wiring, the same current under measurement can be made to flow to each conductor.

Furthermore, with such a configuration, the magnetic field applied to the position of the first magnetic sensor 30-1 due to the current under measurement flowing through the first conductor group and the magnetic field applied to the position of the second magnetic sensor 30-2 due to the current under measurement flowing through the second conductor group have directions that are opposite each other. By calculating the difference between the outputs of two magnetic sensors 30, it is possible to improve the S/N ratio in the measurement of the current under measurement.

Figure 14:
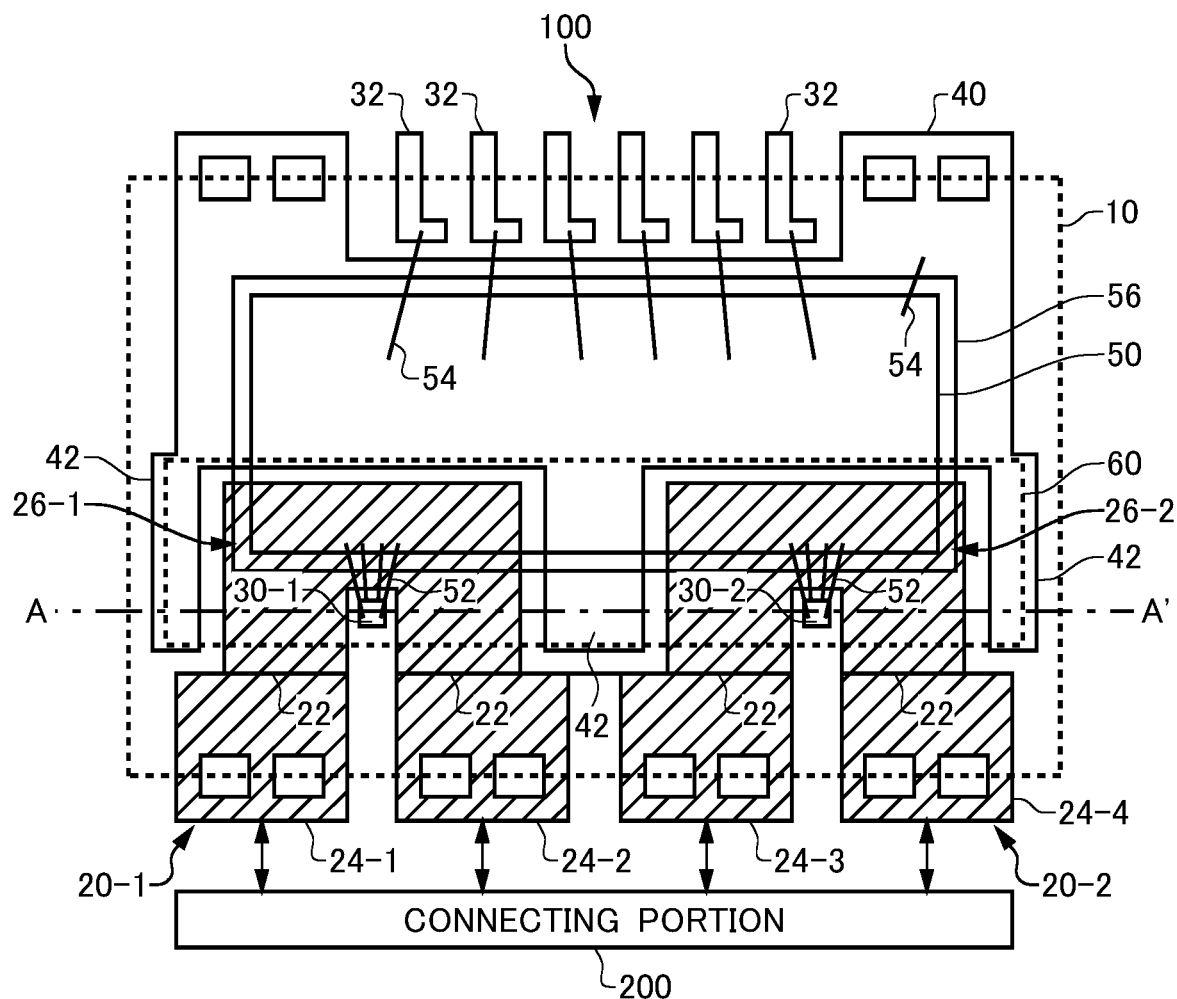
FIG. 14 shows another exemplary structure of the current sensor 100.

FIG. 14 shows another exemplary structure of the current sensor 100. The current sensor 100 in the present example further includes an insulating member 56, compared to the structure shown in FIG. 1. The insulating member 56 is an example of a first insulating member. The insulating member 56 is a polyimide sheet, for example. The insulating member 56 is arranged on the top surfaces of the first conductor 20-1 and the second conductor 20-2. The insulating member 56 in the present example is also arranged on the top surface of the lead frame 40.

The signal processing chip 50 is arranged on the insulating member 56. At least a portion of the signal processing chip 50 is arranged above the first conductor 20-1 and the second conductor 20-2. The signal processing chip 50 in the present example is arranged spanning across a region above the lead frame 40, the first conductor 20-1, and the second conductor 20-2.

By arranging the signal processing chip 50 to span across the region above the conductors 20, the lead frame 40 can be made smaller. Therefore, it is possible to miniaturize the current sensor 100. Furthermore, the signal processing chip 50 can be arranged near each magnetic sensor 30. Therefore, it is possible to reduce the temperature difference between the magnetic sensors 30 and the signal processing chip 50. The signal processing chip 50 may include a temperature detecting section that detects the temperature. The signal processing chip 50 may correct the operation of a magnetic sensor 30 or an output signal of a magnetic sensor 30, based on the detected temperature. By reducing the temperature difference between the signal processing chip 50 and the magnetic sensors 30, it is possible to improve the accuracy of this correction.

Figure 15:
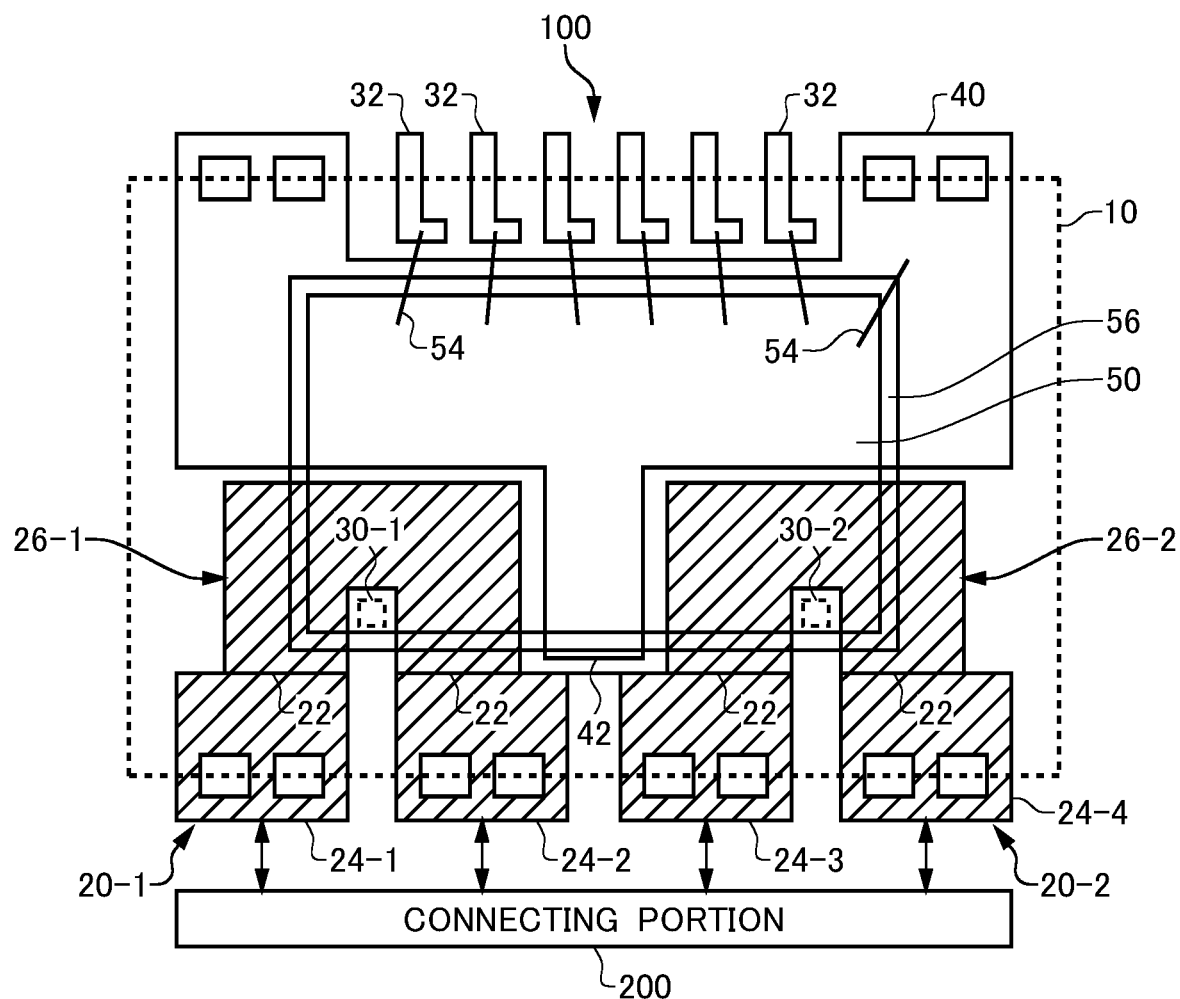
FIG. 15 shows another exemplary configuration of the current sensor 100.

FIG. 15 shows another exemplary configuration of the current sensor 100. In the current sensor 100 of the present example, the insulating member 56 is included in the same manner as in the example of FIG. 14, and the magnetic sensors 30 are formed within the signal processing chip 50. For example, the magnetic sensors 30 may also be integrated on the semiconductor substrate on which the signal processing circuit is formed. With such a configuration as well, it is possible to reduce the size of the current sensor 100.

In this case, the portions of the signal processing chip 50 where the magnetic sensors 30 are formed are arranged above the regions inside the bent portions 26. Similarly, portions of the insulating member 56 may also be arranged above the regions inside the bent portions 26. In FIG. 15, the portions where the magnetic sensors 30 are formed are indicated by dotted lines. Furthermore, in the current sensor 100 of the present example, the insulating member 60 can be omitted.

In FIGS. 14 and 15, an example is described in which the insulating member 56 is provided in the current sensor 100, but the insulating member 56 may be provided in the current sensor 300 or the current sensor 400, and the signal processing chip 50 may be arranged on the insulating member 56. Furthermore, in the current sensor 300 or the current sensor 400, the magnetic sensors 30 may be formed within the signal processing chip 50.

Fourth Embodiment

Figure 16:
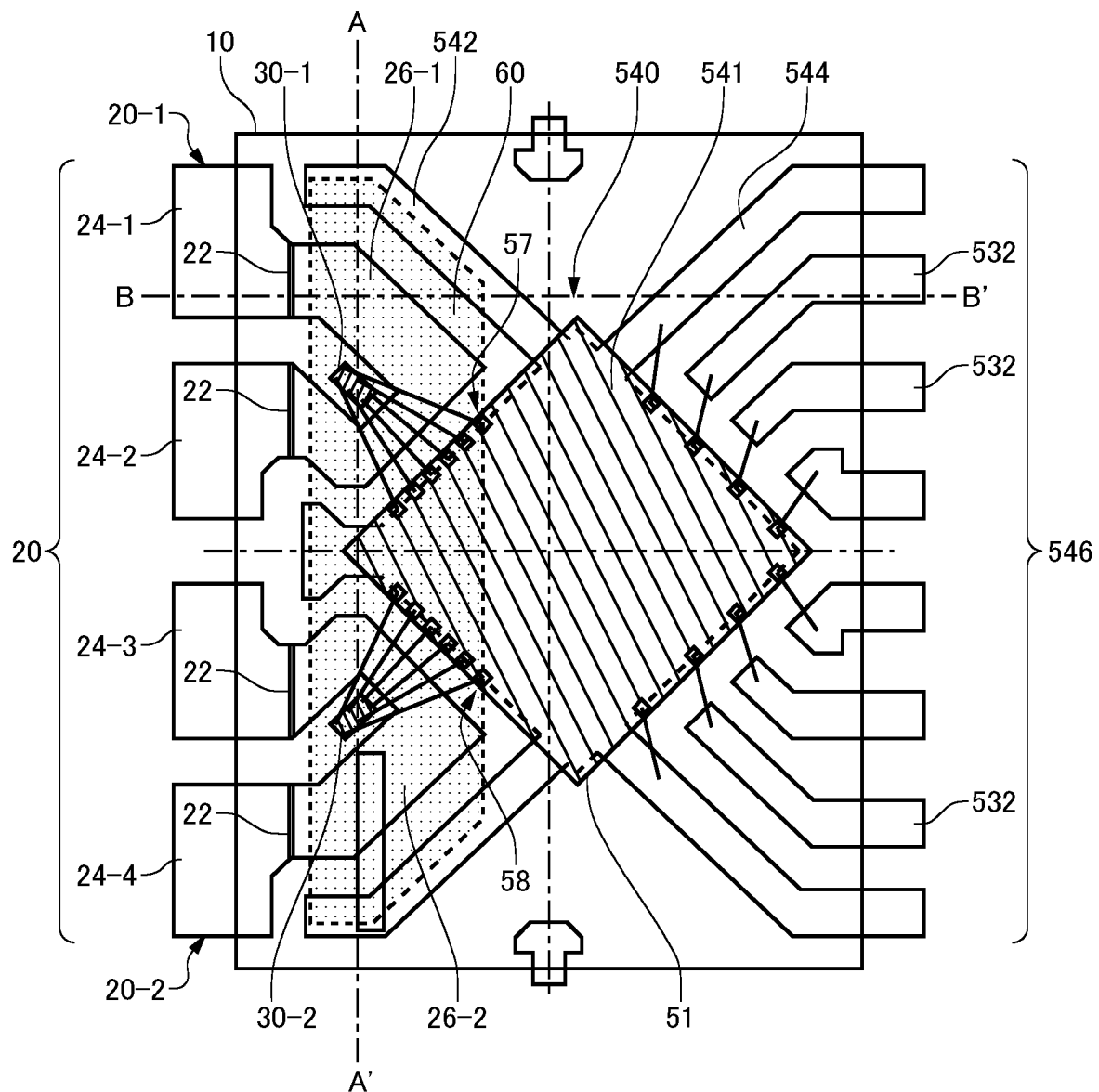
FIG. 16 is a planar view of a current sensor 500 according to a fourth embodiment of the present invention seen transparently from the top portion.
Figure 17:
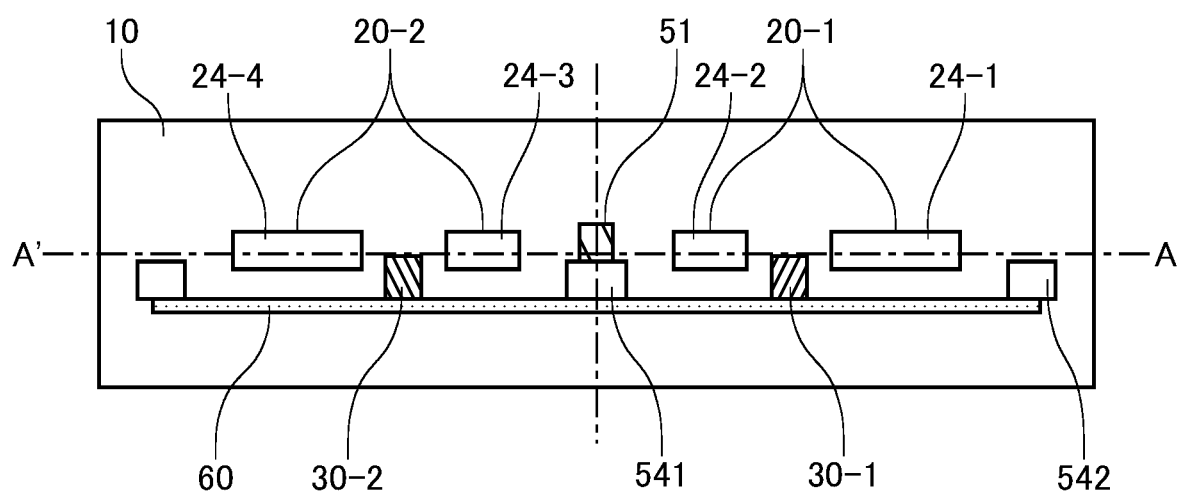
FIG. 17 shows a cross-sectional configuration of the current sensor 500 in a case where the current sensor 500 in FIG. 16 is cleaved on the reference line A-A'.
Figure 18:
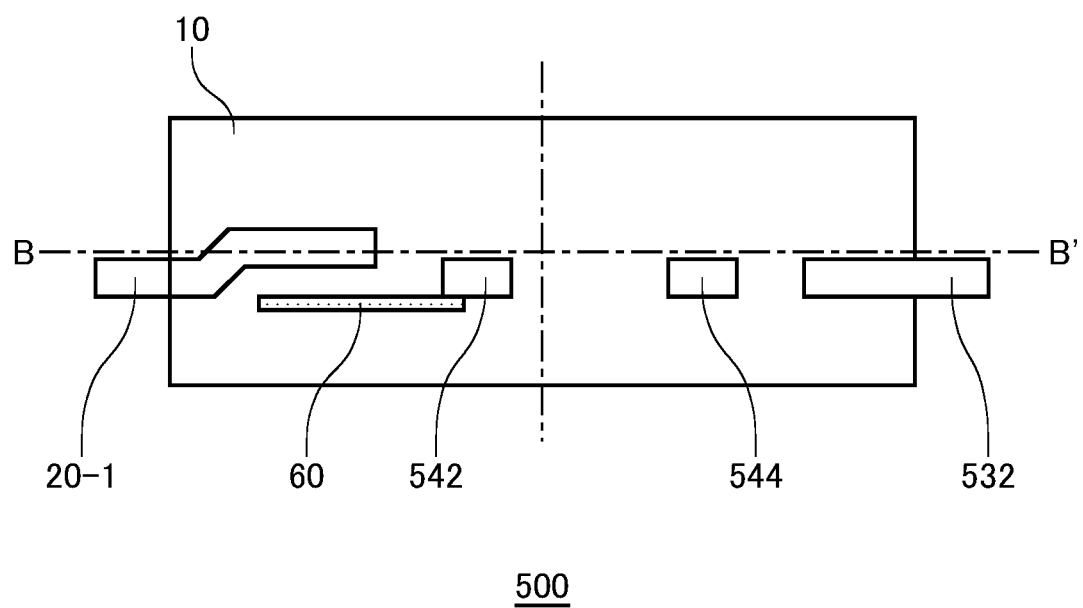
FIG. 18 shows a cross-sectional configuration of the current sensor 500 in a case where the current sensor 500 in FIG. 16 is cleaved on the reference line B-B'.

FIGS. 16 to 18 show an internal configuration of a current sensor 500 according to a fourth embodiment of the present invention. Here, FIG. 16 is a planar view of the current sensor 500 seen transparently from the top portion, FIG. 17 shows a cross-sectional configuration of the current sensor 500 in a case where the current sensor 500 in FIG. 16 is cleaved on the reference line A-A', and FIG. 18 shows a cross-sectional configuration of the current sensor 500 in a case where the current sensor 500 in FIG. 16 is cleaved on the reference line B-B'. The current sensor 500 in the present embodiment solves the problem that, when the sealing portion is made smaller relative to the signal processing chip in order to miniaturize the current sensor, there is not enough space to arrange the magnetic sensors and the primary conductors within the sealing portion.

Here, the up-down direction in FIG. 16 is the vertical direction, the left-right directions in FIGS. 16 and 18 are the horizontal direction, the up-down directions in FIGS. 17 and 18 are the height direction, the plane formed by the vertical direction and the horizontal direction is the main plane, and the top side and bottom side of the main plane are the top surface side and bottom surface side. Furthermore, the term "in the planar view" includes a view of the main plane side from a viewpoint relative to the main surface. The current sensor 500 of the present embodiment is a current sensor that detects the amount of current input to a current path using the magnetic sensors, but as described further below, the current sensor 500 may be another type of sensor.

The current sensor 500 includes the first magnetic sensor 30-1, the second magnetic sensor 30-2, the first conductor 20-1, the second conductor 20-2, the signal processing circuit 51, a frame portion 540, a terminal portion 532, the insulating member 60, and the sealing portion 10.

The first magnetic sensor 30-1 and the second magnetic sensor 30-2 (in the following, the plurality of magnetic sensors may be referred to collectively as the "magnetic sensors 30") measure the magnitude of the current under measurement by measuring the magnetic field generated from the current under measurement. For example, the magnetic sensors 30 may be magnetic sensors including Hall elements with top surface sides acting as the magnetically sensitive portions. The first magnetic sensor 30-1 and the second magnetic sensor 30-2 may be manufactured simultaneously in large numbers by being diced from a multi-surface substrate or the like, and may have outer shapes that are rectangular in the planar view.

The first magnetic sensor 30-1 is arranged on the main plane in the current sensor 500, and the second magnetic sensor 30-2 is arranged on the main plane in the current sensor 500. The same type of element can be adopted for both the first magnetic sensor 30-1 and the second magnetic sensor 30-2.

As shown in FIG. 16, the first magnetic sensor 30-1 and the second magnetic sensor 30-2 may each have six terminals, among which four terminals are connected respectively to end portions of cross-shaped Hall elements and the remaining two terminals are connected to coils of the Hall elements used for sensitivity adjustment, for example. The terminals of the first magnetic sensor 30-1 and the terminals of the second magnetic sensor 30-2 are each connected to the signal processing circuit 51 through bonding wires, receive the drive current or drive voltage from the signal processing circuit 51, and output voltages corresponding to the strengths of the detected magnetic field to the signal processing circuit 51 as output signals.

The first conductor 20-1 and the second conductor 20-2 are the primary conductors. The first conductor 20-1 provides a current path through which flows the current detected by the first magnetic sensor 30-1, i.e. the current under measurement. The second conductor 20-2 provides a current path through which flows the current under measurement detected by the second magnetic sensor 30-2. The first conductor 20-1 and the second conductor 20-2 are distanced from each other in the vertical direction in the drawing. The first conductor 20-1 causes the current under measurement to flow near the first magnetic sensor 30-1. The second conductor 20-2 causes the current under measurement to flow near the second magnetic sensor 30-2.

Each conductor 20 is formed by a conductive material such as metal. Each conductor 20 includes a bent portion 26, in the planar view. The first conductor 20-1 includes the bent portion 26-1 that surrounds the first magnetic sensor 30-1. The second conductor 20-2 includes the bent portion 26-2 that surrounds the second magnetic sensor 30-2. The first magnetic sensor 30-1 is provided within the sealing portion 10 and arranged inside the first conductor 20-1, in the planar view. The second magnetic sensor 30-2 is provided within the sealing portion 10 and arranged inside the second conductor 20-2, in the planar view. For example, at least a portion of the first conductor 20-1 is arranged at a position opposite three or more sides of the rectangular first magnetic sensor 30-1 in the planar view, and at least a portion of the second conductor 20-2 is arranged at a position opposite three or more sides of the rectangular second magnetic sensor 30-2 in the planar view. In this way, it is possible to increase the current-to-magnetic-field conversion coefficient for converting the current under measurement flowing through the first conductor 20-1 and the second conductor 20-2, and therefore the accuracy of the measurement of the current under measurement by the magnetic sensors 30 can be increased. The end portion 24-1 and end portion 24-2 of the first conductor 20-1 and the end portion 24-3 and end portion 24-4 of the second magnetic sensor 30-2 may function as terminals when the current sensor 500 is mounted on a printed substrate or the like.

Each conductor 20 may include stepped portions 22 between the bent portion 26 and the end portions 24. For example, the stepped portions 22 may be provided such that the signal processing circuit 51 side, i.e. the bent portion 26 side, becomes higher than an end portion 24 side. For example, as shown in FIG. 18, the stepped portions 22 are provided such that the right side of each of the first conductor 20-1 and the second conductor 20-2 becomes higher. In this way, it is possible to increase the insulation withstand voltage between each conductor 20 and magnetic sensor 30, and also to bring the center position of each conductor 20 in the thickness direction closer to the height position of the magnetically sensitive portions of the magnetic sensors 30 and to improve the measurement accuracy of the current under measurement by the magnetic sensors 30.

As an example, the orientation of the current flowing through the first conductor 20-1 may be different than the orientation of the current flowing through the second conductor 20-2. For example, the current under measurement may flow clockwise in the first conductor 20-1, and the current under measurement may flow counter-clockwise in the second conductor 20-2. In this way, the directions of the effects of disturbances such as external magnetic fields can be substantially cancelled out. In other words, the current sensor 500 can calculate the difference between the output signal of the first magnetic sensor 30-1 and the output signal of the second magnetic sensor 30-2 and cancel out the effects of disturbances.

As an example, the first conductor 20-1 and the second conductor 20-2 may be connected in parallel to the current under measurement. Alternatively, the first conductor 20-1 and the second conductor 20-2 may be connected in series to the current under measurement. Detailed examples of the serial connection and the parallel connection of the first conductor 20-1 and the second conductor 20-2 are provided further below.

The signal processing circuit 51 may be configured as the signal processing chip 50 described above. The signal processing circuit 51 processes the output signals of the magnetic sensors 30 to calculate the magnitude of the current under measurement flowing through the conductors 20. The signal processing circuit 51 may house at least one of a memory, a sensitivity correcting circuit, an offset correcting circuit that corrects the offset of the output, an amplification circuit that amplifies the output signals from the magnetic sensors 30, a difference computing circuit that computes the difference between the output signal of the first magnetic sensor 30-1 and the output signal of the second magnetic sensor 30-2, a temperature correcting circuit that corrects the output according to the temperature, and the like.

In the present example, the signal processing circuit 51 adopts a hybrid configuration manufactured from the magnetic sensors 30 and a separate substrate serving as an independent device. Instead, the signal processing circuit 51 may adopt a monolithic configuration manufactured from the magnetic sensors 30 and the same substrate, e.g. a silicon substrate. In the case of a monolithic configuration, a configuration may be used in which the magnetic sensors 30 are included in the signal processing circuit 51, as described in FIG. 15.

The signal processing circuit 51 may have a rectangular shape in the planar view of the main plane. As an example, the signal processing circuit 51 may have a square shape in the planar view of the main plane, as shown in FIG. 16. In this way, it is possible to maximize the planar size of the signal processing circuit 51 that can be sealed by the sealing portion 10 having a prescribed size. Furthermore, by arranging the square signal processing circuit 51 near the center of the sealing portion 10, it is possible to reduce the effect of stress on the output of the current sensor 500.

The shapes and lengths of the wires connecting the first magnetic sensor 30-1 to the signal processing circuit 51 and the wires connecting the second magnetic sensor 30-2 to the signal processing circuit 51 may be equivalent. Furthermore, each wire connecting the first magnetic sensor 30-1 to the signal processing circuit 51 may abere linearly symmetrical with respect to an axis that is a normal line passing through the center of the first magnetic sensor 30-1 toward one side of the signal processing circuit 51 opposite the first magnetic sensor 30-1. Each wire of the second magnetic sensor 30-2 has the same symmetry. In this way, it is possible to make the parasitic capacitance between the first conductor 20-1 and second conductor 20-2 and each wire uniform, thereby avoiding deterioration of the response characteristics of the magnetic sensors 30.

The frame portion 540 includes a body portion 541, a first extending portion 542, and a second extending portion 544, has the signal processing circuit 51 mounted thereon, and supports the insulating member 60. The frame portion 540 may be formed by metal with favorable thermal conduction characteristics. The frame portion 540 and the first extending portion 542 may correspond to the lead frame 40 and protruding portions 42 shown in FIGS. 1 to 15.

The body portion 541 has the signal processing circuit 51 mounted on the top surface thereof. The body portion 541 may have approximately the same shape as the signal processing circuit 51 (e.g. rectangular or square in the present example), a shape similar to the shape of the signal processing circuit 51, or a different shape than the signal processing circuit 51. The body portion 541 may be smaller than the signal processing circuit 51. The body portion 541 may be arranged in the approximate center of the current sensor 500 or the sealing portion 10.

The first extending portion 542 is formed protruding from at least one side of the body portion 541 toward the outside. In the present example, the first extending portion 542 includes an arm portion extending up and left from the upper left side of the body portion 541 and an arm portion extending down and left from the lower left side of the body portion 541. The first extending portion 542 supports the insulating member 60 described further below on the back surface thereof.

The second extending portion 544 is formed protruding from at least one side of the body portion 541 toward the outside, separately from the first extending portion 542. In the present example, the second extending portion 544 includes an arm portion extending up and right from the upper right side of the body portion 541 and an arm portion extending down and right from the lower right side of the body portion 541. The second extending portion 544, in addition to supporting the body portion 541, is connected to the signal processing circuit 51 through a bonding wire or the like to function as a terminal of the signal processing circuit 51.

At least a portion of the first extending portion 542 and the second extending portion 544 may be symmetrical (e.g. rotational symmetry or mirror symmetry) with the center of mass of the body portion 541 (or the current sensor 500) as a center. For example, the first extending portion 542 and the second extending portion 544 have approximate right-left symmetry in FIG. 16. In this way, it is possible to reduce the effect of stress on the output of the current sensor 500.

The terminal portion 532 is connected to the signal processing circuit 51 through a bonding wire or the like, and may function together with the second extending portion 544 as the device terminal 546 of the signal processing circuit 51. The terminal portion 532 may be formed by the same material as the frame portion 540. The terminal portion 532 may correspond to the lead frame 32 described in FIGS. 1 to 15.

In the present example, eight device terminals 546 are connected to the signal processing circuit 51. In this way, the signal processing circuit 51 inputs and outputs the calculation results of the amount of current conducted through the conductors 20, along with parameter settings and the like, via the eight device terminals 546. Furthermore, by setting the frame portion 540 at a ground potential or constant potential, the frame portion 540 fulfills the role of an electrostatic shield that blocks electrostatic noise coming from the back surface side of the current sensor 500.

The insulating member 60 is secured by an adhesive or the like to the first extending portion 542 of the frame portion 540 on the bottom surface of the body portion 541. The insulating member 60 may be an insulating film. The insulating member 60 has the magnetic sensors 30 mounted thereon and is distanced from the first conductor 20-1 and the second conductor 20-2. In this way, the insulating member 60 has high insulation due to there being no creepage surface formed with the conductors 20, and can also secure the magnetic sensors 30 to the frame portion 540 without coming loose.

The sealing portion 10 has the configurational components of the current sensor 500, such as the magnetic sensors 30 and the signal processing circuit 51, secured therein, and insulates and protects the first conductor 20-1, the second conductor 20-2, the frame portion 540, and the terminal portion 532. The sealing portion 10 may secure at least a portion of the first conductor 20-1, the second conductor 20-2, the frame portion 540, and the terminal portion 532. For example, as shown in FIG. 16, the sealing portion 10 may seal a portion of the first conductor 20-1 other than the end portion 24-1 and the end portion 24-2 and a portion of the second conductor 20-2 other than the end portion 24-3 and the end portion 24-4, and may expose the unsealed end portions 24-1 to 24-4 as terminals. Furthermore, the sealing portion 10 may seal remaining portions such that the end portions of the device terminals 546 on one side are exposed.

The sealing portion 10 is formed by molding using resin with excellent insulating capabilities, such as epoxy resin, for example. The sealing package may have a rectangular solid shape that is rectangular in the planar view, for example. As an example, the sealing package may ha a square shape in the planar view.

The following describes the signal processing circuit 51 and the arrangement in the main plane of the sealing portion 10.

In the present embodiment, the signal processing circuit 51 is arranged at an angle relative to the sealing portion 10 in the planar view. For example, each side forming the contour of the signal processing circuit 51 may be arranged at an angle relative to one or more sides that are opposite thereto and form the contour of the sealing portion 10. As an example, the rectangular signal processing circuit 51 may be arranged at an angle relative to the rectangular sealing portion 10.

With such an arrangement, space can be focused at the four corners of the sealing portion 10, and it is possible to arrange the magnetic sensors 30 and the conductors 20 in this space with room to spare. For example, in FIG. 16, even after the first magnetic sensor 30-1 has been arranged in the upper left space of the sealing portion 10, it is possible to preserve enough of an interval between the first magnetic sensor 30-1 and the signal processing circuit 51 and between the first magnetic sensor 30-1 and the outer edge portion of the sealing portion 10.

Therefore, in the example shown in FIG. 16, it is possible to arrange the first conductor 20-1 around the first magnetic sensor 30-1 such that the first conductor 20-1 surrounds the first magnetic sensor 30-1. In this way, the magnetic field in the vertical direction generated in the region surrounded by the first conductor 20-1 becomes larger, and the measurement accuracy of the current under measurement by the first magnetic sensor 30-1 can be improved. The same is true for the second magnetic sensor 30-2 and the second conductor 20-2.

Furthermore, with the current sensor 500 of the present embodiment, the sealing portion 10 can have a miniaturized size relative to the size of the signal processing circuit 51, and therefore the overall current sensor 500 can be miniaturized while maintaining performance capability.

As an example, as shown in FIG. 16, the signal processing circuit 51 may be arranged at an inclination of 45° relative to the sealing portion 10 in the planar view. In this way, it is possible to maximize the space created at the four corners of the sealing portion 10. The angle of inclination between the signal processing circuit 51 and the sealing portion 10 may be an angle other than 45°. For example, if the inclination between the signal processing circuit 51 and the sealing portion 10 is in a range from 30° to 60°, sufficient space can be created at the four corners of the sealing portion 10.

The following describes the signal processing circuit 51 and the arrangement of the magnetic sensors 30 on the main plane.

The first magnetic sensor 30-1 and the second magnetic sensor 30-2 may be arranged respectively at positions opposite two sides of the signal processing circuit 51. The sensor connecting portion 57 and the sensor connecting portion 58 may be arranged respectively along the two sides adjacent to the signal processing circuit 51. The sensor connecting portion 57 may be used to connect the signal processing circuit 51 and the first magnetic sensor 30-1 opposite thereto. The sensor connecting portion 58 may be used to connect the signal processing circuit 51 and the second magnetic sensor 30-2 opposite thereto. The sensor connecting portion 57 and the sensor connecting portion 58 may each include a plurality of bonding pads. With the configuration described above, two sides of the signal processing circuit 51 can be used to realize the connection with the plurality of magnetic sensors 30, and therefore the lengths of the sides of the signal processing circuit 51 can be made shorter than in a case where only one side of the signal processing circuit 51 is used to realize the connection with the plurality of magnetic sensors 30.

For example, in FIG. 16, the first magnetic sensor 30-1 is arranged at a position opposite the upper left side of the signal processing circuit 51, and is connected to the bonding pads on the upper left side of the signal processing circuit 51 through bonding wires. Similarly, the second magnetic sensor 30-2 is arranged at a position opposite the lower left side of the signal processing circuit 51, and is connected to the bonding pads on the lower left side of the signal processing circuit 51 through bonding wires.

Furthermore, magnetic sensors 30 may be arranged respectively at positions opposite each of two or more adjacent sides of the signal processing circuit 51. In this way, the magnetic sensors 30 are arranged at positions near the signal processing circuit 51, and so it becomes easy to handle the conductors 20 arranged within the sealing portion 10. For example, in FIG. 16, the magnetic sensors 30 are arranged respectively at positions opposite adjacent sides (the upper left side and the lower left side) of the signal processing circuit 51. Furthermore, it becomes possible to arrange the first magnetic sensor 30-1 and the second magnetic sensor 30-2 with linear symmetry (up-down symmetry in FIG. 16) with the signal processing circuit 51 as the center, thereby making it possible to improve the AC characteristics such as dv/dt.

The first magnetic sensor 30-1 and the second magnetic sensor 30-2 may each be arranged at an angle relative to the sealing portion 10 in the planar view. For example, each of the sides forming the contours of the first magnetic sensor 30-1 and the second magnetic sensor 30-2 may be arranged at an angle relative to an opposite side among the one or more sides forming the contour of the sealing portion 10.

As an example, in the embodiment shown in FIG. 16, the first magnetic sensor 30-1 and the second magnetic sensor 30-2 are each at an angle of 45° relative to the rectangular sealing portion 10, and therefore each of the sides of the first magnetic sensor 30-1 and the second magnetic sensor 30-2 is arranged parallel to each side of the signal processing circuit 51 in the planar view. In this way, it is possible to prevent the wires connecting the first magnetic sensor 30-1 and the signal processing circuit 51 from intersecting, and to maintain symmetry between the plurality of wires. The same is true for the wires connecting the second magnetic sensor 30-2 and the signal processing circuit 51.

In FIGS. 16 to 18, an embodiment is described in which the conductors 20 are arranged between the magnetic sensors 30 and the signal processing circuit 51, but the arrangement is not limited to this. For example, the magnetic sensors 30 may be arranged between the conductors 20 and the signal processing circuit 51. With this arrangement, the orientation of the current in the first conductor 20-1 and the second conductor 20-2 is determined such that the orientations of the magnetic fields at the arrangement positions of the first magnetic sensor 30-1 and second magnetic sensor 30-2 are the opposite of each other.

Figure 19:
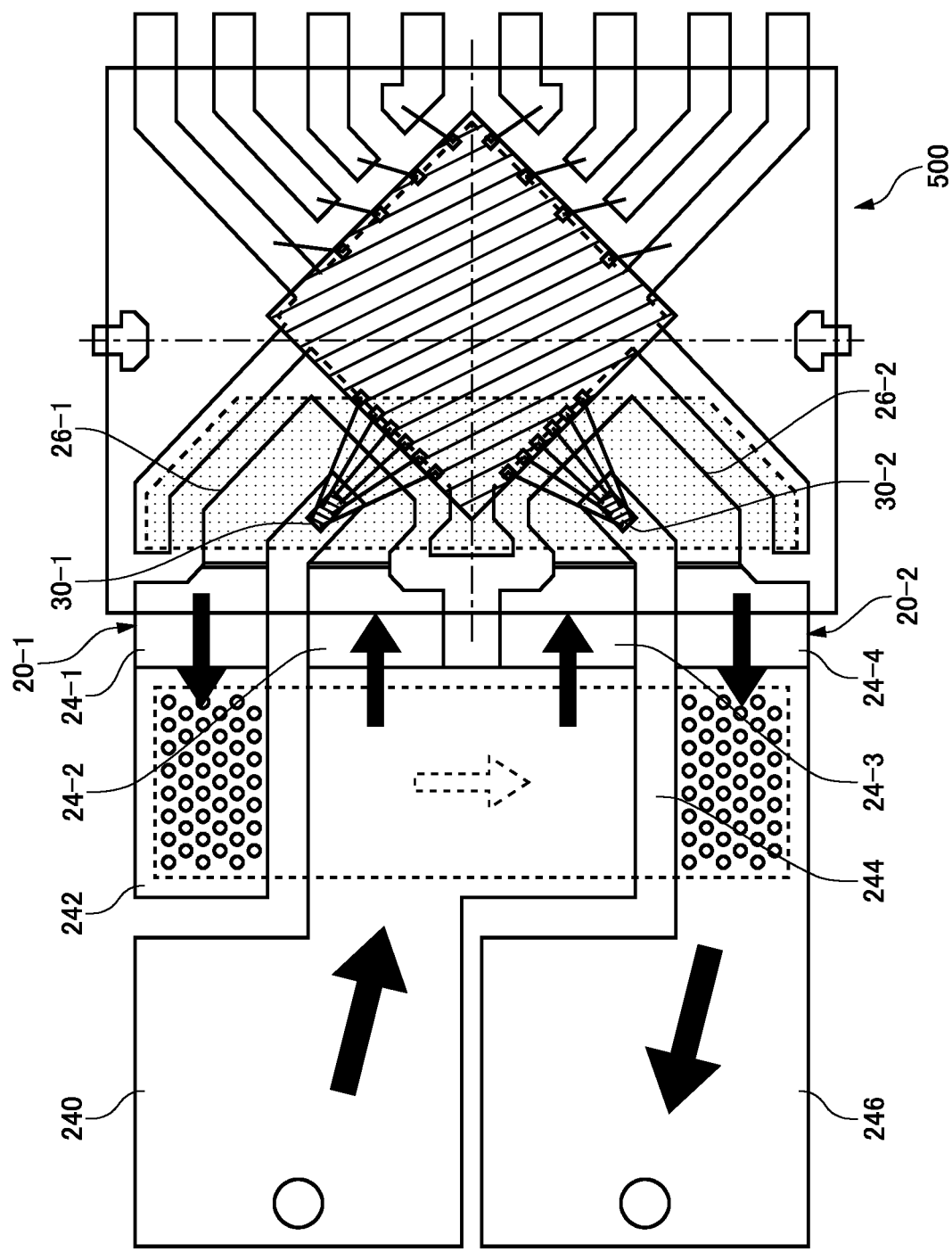
FIG. 19 shows an exemplary current path in a case where the first conductor 20-1 and the second conductor 20-2 are connected in parallel.

FIG. 19 shows an exemplary current path in a case where the first conductor 20-1 and the second conductor 20-2 are connected in parallel. In the present example, the current sensor 500 may be the same as described in FIGS. 16 to 18, and the current sensor 500 is mounted on a printed substrate. The first conductor 20-1 includes the end portion 24-1 and the end portion 24-2, and the second conductor 20-2 includes the end portion 24-3 and the end portion 24-4. Furthermore, the black arrow marks and solid lines in the drawing indicate the front surface side of the printed substrate, and the dotted-line arrows and dotted lines indicate the back surface side of the printed substrate.

In the example shown in FIG. 19, the current under measurement supplied to the first conduction path 240 on the front surface of the print substrate flows into each of the end portion 24-2 of the first conductor 20-1 and the end portion 24-3 of the second conductor 20-2. For example, currents obtained by equally dividing the current under measurement flow into the end portion 24-2 and the end portion 24-3. In this way, identical currents with opposite orientations flow respectively through the first conductor 20-1 and the second conductor 20-2. The current flowing from the end portion 24-2 of the first conductor 20-1 circulates in a counter-clockwise direction from the lower left side of the first magnetic sensor 30-1 and is output to the second conduction path 242 on the front surface of the printed substrate from the end portion 24-1 of the first conductor 20-1.

The current input to the second conduction path 242 flows through the third conduction path 244 formed on the back surface through a via penetrating through the printed substrate, and flows again through the fourth conduction path 246 formed on the front surface of the printed substrate through another via. On the other hand, the current flowing from the end portion 24-3 of the second conductor 20-2 circulates clockwise from the upper left side of the second magnetic sensor 30-2 and merges in the fourth conduction path 246 from the end portion 24-4 of the second conductor 20-2.

In this way, in the example of FIG. 19, the current under measurement is divided near each of the first magnetic sensor 30-1 and the second magnetic sensor 30-2 to flow in parallel. Therefore, it is possible to reduce the amount of heat generated by each magnetic sensor 30 and to reduce the effect of heat generation on the measurement of the current under measurement.

Here, the current under measurement has opposite orientations for the first magnetic sensor 30-1 and the second magnetic sensor 30-2. In other words, the magnetic fields generated by the current under measurement applied to the first magnetic sensor 30-1 and the second magnetic sensor 30-2 have orientations that are the opposite of each other, while the external magnetic fields acting as noise have the same orientations as each other. Accordingly, by calculating the difference between the output of the first magnetic sensor 30-1 and the output of the second magnetic sensor 30-2, the signal processing circuit 51 can cancel out the effect of the external magnetic fields and measure the current under measurement with higher accuracy.

Furthermore, with the example shown in FIG. 19, even when a difference occurs between the current under measurement flowing through the first conductor 20-1 and the current under measurement flowing through the second conductor 20-2 due to the effect of variations in the machining of the conductors 20 and the printed substrate, the difference between the currents under measurement is constant. Accordingly, it is possible to detect the current under measurement with high accuracy regardless of machining variations or the like.

Figure 20:
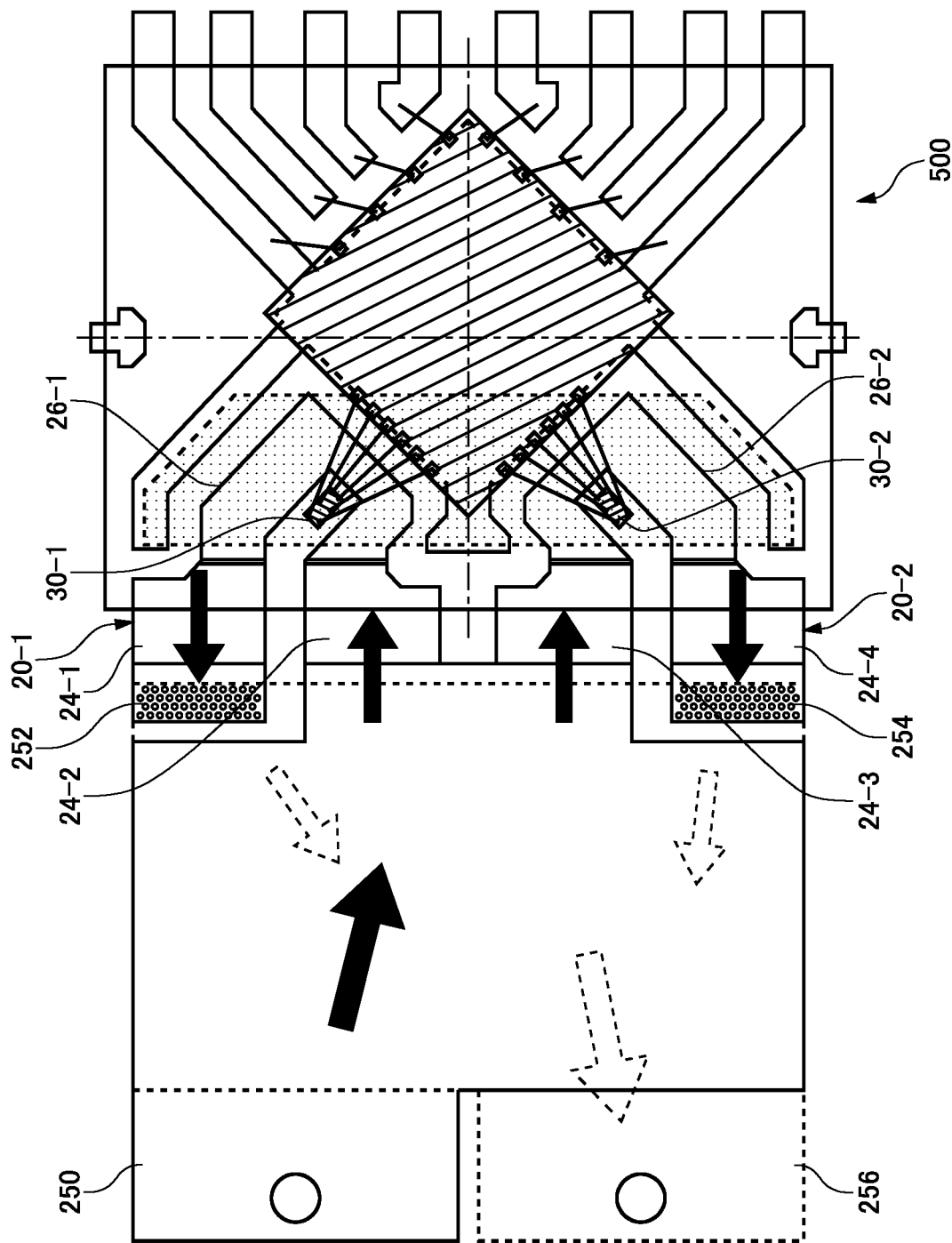
FIG. 20 shows another exemplary current path in a case where the first conductor 20-1 and the second conductor 20-2 are connected in parallel.

FIG. 20 shows another exemplary current path in a case where the first conductor 20-1 and the second conductor 20-2 are connected in parallel. Descriptions concerning items common to FIG. 19 are omitted.

In the present example, the current under measurement supplied to the first conduction path 250 on the front surface of the printed substrate flows into each of the end portion 24-2 and the end portion 24-3. For example, currents obtained by equally dividing the current under measurement flow into the end portion 24-2 and the end portion 24-3. In this way, identical currents with opposite orientations flow respectively through the first conductor 20-1 and the second conductor 20-2. The current flowing from the end portion 24-2 of the first conductor 20-1 circulates in a counter-clockwise direction from the lower left side of the first magnetic sensor 30-1 and is output to the second conduction path 252 on the front surface from the end portion 24-1 of the first conductor 20-1.

The current input to the second conduction path 252 is input to the fourth conduction path 256 formed on the back surface of the printed substrate through a via penetrating through the printed substrate. On the other hand, the current flowing from the end portion 24-3 of the second conductor 20-2 circulates clockwise from the upper left side of the second magnetic sensor 30-2 and is output to the third conduction path 254 on the front surface from the end portion 24-4 of the second conductor 20-2. The current input to the third conduction path 254 merges in the fourth conduction path 256 through a via penetrating through the printed substrate.

With the example shown in FIG. 20, unlike in the example shown in FIG. 19, it is possible to input the current under measurement from the front surface of the printed substrate and output the current under measurement from the back surface.

Figure 21:
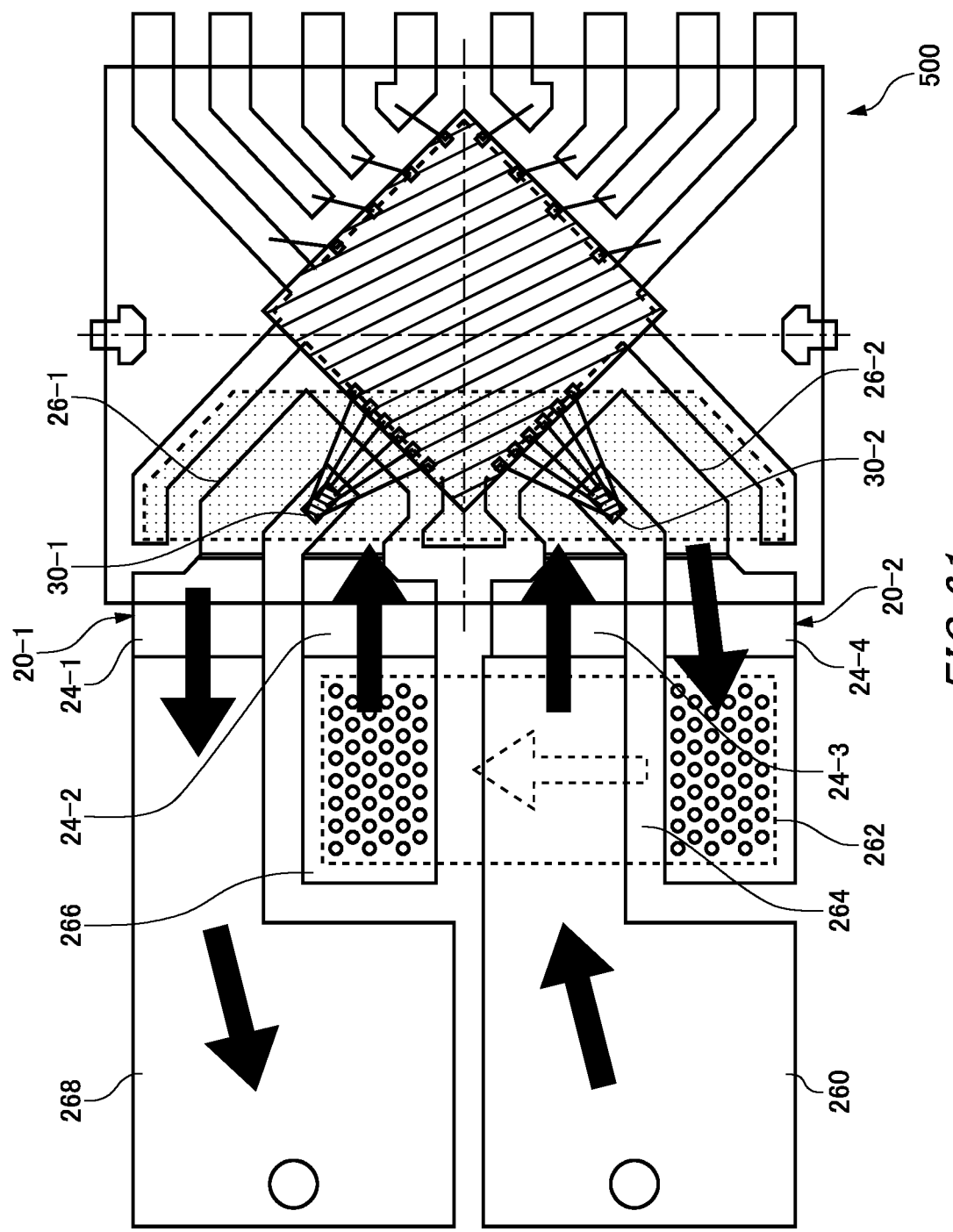
FIG. 21 shows an exemplary current path in a case where the first conductor 20-1 and the second conductor 20-2 are connected in series.

FIG. 21 shows an exemplary current path in a case where the first conductor 20-1 and the second conductor 20-2 are connected in series. Descriptions concerning items common to FIG. 19 are omitted.

In the present example, the current under measurement supplied to the first conduction path 260 on the front surface of the printed substrate flows into the end portion 24-3 of the second conductor 20-2. In this way, the current under measurement flows through the second conductor 20-2. The current under measurement circulates in a clockwise direction from the upper left side of the second magnetic sensor 30-2 in the second conductor 20-2 and is output to the second conduction path 262 on the front surface from the end portion 24-4 of the second conductor 20-2.

The current under measurement input to the second conduction path 262 is input to the third conduction path 264 formed on the back surface through a via penetrating through the printed substrate, and again flows through the fourth conduction path 266 formed on the front surface through the via. The current under measurement flows through the first conductor 20-1 from the fourth conduction path 266, via the end portion 24-2 of the first conductor 20-1. The current under measurement circulates counter-clockwise from the bottom left side of the first magnetic sensor 30-1 in the first conductor 20-1, and is output to the fifth conduction path 268 formed on the front surface of the printed substrate via the end portion 24-1 of the first conductor 20-1.

In this way, with the example shown in FIG. 21, the first conductor 20-1 and the second conductor 20-2 are connected in series for the current under measurement, and therefore the current sensor 500 can measure the current under measurement with a plurality of magnetic sensors 30, thereby enabling the current under measurement to be measured with a higher sensitivity, i.e. a higher S/N ratio, than in a case where the conductors 20 are connected in parallel.

Furthermore, the current under measurement flows through the first magnetic sensor 30-1 and the second magnetic sensor 30-2 with opposite orientations, and therefore, by calculating the difference between the outputs of the first magnetic sensor 30-1 and the second magnetic sensor 30-2, the signal processing circuit 51 can cancel out the effect of external magnetic fields and measure the current under measurement with higher accuracy.

For example, when the current sensor 500 is used in a situation where a relatively large current under measurement (e.g. greater than or equal to 35 A) is flowing, the first conductor 20-1 and the second conductor 20-2 may be connected in parallel, as described in FIGS. 19 and 20. On the other hand, when the current sensor 500 is used in a situation where a relatively small current under measurement (e.g. less than 35 A) is flowing, the first conductor 20-1 and the second conductor 20-2 may be connected in series, as described in FIG. 21.

The above is a description of an example of the current sensor 500 in which two magnetic sensors 30 are provided, but the number of magnetic sensors 30 is not limited to two. The current sensor 500 may have three, four, or more magnetic sensors 30 mounted thereon. For example, three or more magnetic sensors 30 may be provided at positions corresponding to three or more edges of the signal processing circuit 51. In this case, the device terminals 546 may be provided above and/or below the signal processing circuit 51 in FIG. 16.

Furthermore, the above description relates to a current sensor 500, but the present embodiment can be applied to sensors other than current sensors. For example, the sensor may be a position sensor, light sensor, infrared sensor, or the like, as long as this sensor includes an arbitrary sensor chip and a signal processing circuit sealed in a package.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: sealing portion, 20: 20 outer conductor 21: outer conductor, 22: stepped portion, 24: end portion, 26: bent portion, 30: magnetic sensor, 32: lead frame, 40: lead frame, 42: protruding portion, 50: signal processing chip, 51: signal processing circuit, 52, 54: wire, 56: insulating member, 57, 58: sensor connecting portion, 60: insulating member, 100: current sensor, 200: connecting portion, 202, 204, 206, 208, 210, 214, 216, 218, 220, 222, 224, 226, 228, 230, 232, 234: wiring, 240: first conduction path, 242: second conduction path, 244: third conduction path, 246: fourth conduction path, 250: first conduction path, 252: second conduction path, 264: third conduction path, 266: fourth conduction path, 268: fifth conduction path, 300: current sensor, 400: current sensor, 500: current sensor, 540: frame portion, 532: terminal portion, 541: body portion, 542: first extending portion, 544: second extending portion, 546: device terminal

What is claimed is:

1. A current sensor comprising:
   a sealing portion;
   a first conductor that includes a bent portion bent in a planar view within the sealing portion and two end portions that are exposed from the sealing portion;
   a second conductor that includes a bent portion bent in the planar view within the sealing portion and two end portions that are exposed from the sealing portion;
   a first magnetic sensor that is provided within the sealing portion and arranged inside the first conductor in the planar view; and
   a second magnetic sensor that is provided within the sealing portion and arranged inside the second conductor in the planar view, wherein
   one end portion of the first conductor and one end portion of the second conductor are electrically connected such that the same current under measurement flows through the first conductor and the second conductor.

2. The current sensor according to claim 1, further comprising:
   a connecting portion that electrically connects the one end portion of the first conductor and the one end portion of the second conductor.

3. The current sensor according to claim 1, wherein
   the first conductor and the second conductor are electrically connected such that a magnetic field applied to a position of the first magnetic sensor due to the current under measurement flowing through the first conductor and a magnetic field applied to a position of the second magnetic sensor due to the current under measurement flowing through the second conductor have directions that are opposite of each other.

4. The current sensor according to claim 1, further comprising:
   a first outer conductor that includes a bent portion bent in the planar view within the sealing portion and two end portions exposed from the sealing portion, and has the first conductor and the first magnetic sensor arranged inside the bent portion in the planar view; and
   a second outer conductor that includes a bent portion bent in the planar view within the sealing portion and two end portions exposed from the sealing portion, and has the second conductor and the second magnetic sensor arranged inside the bent portion in the planar view.

5. The current sensor according to claim 4, wherein
   the first conductor, the second conductor, the first outer conductor, and the second outer conductor are electrically connected such that the same current under measurement flows through the first conductor, the second conductor, the first outer conductor, and the second outer conductor.

6. The current sensor according to claim 5, wherein
   the first conductor and the first outer conductor are electrically connected such that a magnetic field applied to a position of the first magnetic sensor due to the current under measurement flowing through the first conductor and a magnetic field applied to a position of the first magnetic sensor due to the current under measurement flowing through the first outer conductor are in the same direction as each other,
   the second conductor and the second outer conductor are electrically connected such that a magnetic field applied to a position of the second magnetic sensor due to the current under measurement flowing through the second conductor and a magnetic field applied to a position of the second magnetic sensor due to the current under measurement flowing through the second outer conductor are in the same direction as each other, and
   a first conductor group including the first conductor and the first outer conductor and a second conductor group including the second conductor and the second outer conductor are electrically connected such that the magnetic field applied to the position of the first magnetic sensor and the magnetic field applied to the position of the second magnetic sensor are in opposite directions of each other.

7. The current sensor according to claim 1, further comprising:

a signal processing circuit that calculates a difference between an output of the first magnetic sensor and an output of the second magnetic sensor.

8. The current sensor according to claim 7, wherein the first conductor and the second conductor have shapes that are linearly symmetrical with respect to each other relative to a vertical bisector of a line segment connecting the first magnetic sensor and the second magnetic sensor.

9. The current sensor according to claim 7, wherein the signal processing circuit is arranged at an angle relative to the sealing portion in the planar view.

10. The current sensor according to claim 9, wherein the first magnetic sensor and the second magnetic sensor are respectively arranged at positions opposite two adjacent sides of the signal processing circuit, and a sensor connecting portion used for connecting the signal processing circuit to the first magnetic sensor and the second magnetic sensor is arranged along each of the two sides of the signal processing circuit.

11. The current sensor according to claim 9, wherein the first magnetic sensor and the second magnetic sensor have rectangular shapes, the first magnetic sensor and the second magnetic sensor are arranged at an angle relative to the sealing portion in the planar view, and each side of the first magnetic sensor and the second magnetic sensor is arranged parallel to each side of the signal processing circuit in the planar view.

12. The current sensor according to claim 7, wherein the signal processing circuit is arranged at an angle of 45° relative to the sealing portion in the planar view.

13. The current sensor according to claim 7, comprising:
a frame portion on which the signal processing circuit is mounted; and
an insulating member that is secured to a bottom surface of the frame portion and has the first magnetic sensor and the second magnetic sensor mounted thereon, wherein
the first conductor and the second conductor are each provided with a stepped portion, and
the first conductor and the second conductor are distanced from the insulating member.

14. The current sensor according to claim 7, further comprising a first insulating member arranged on the first conductor and the second conductor, wherein
the signal processing circuit is arranged on the first insulating member.

15. The current sensor according to claim 7, wherein the first magnetic sensor, the second magnetic sensor, and the signal processing circuit are formed on the same semiconductor substrate.

16. The current sensor according to claim 1, wherein the first conductor and the second conductor are connected in series.

17. The current sensor according to claim 1, wherein the first conductor and the second conductor are connected in parallel.

18. The current sensor according to claim 1, further comprising:
a lead frame that is provided separated from the first conductor and the second conductor within the sealing portion and includes protruding portions arranged to sandwich the first conductor and the second conductor in the planar view; and
a second insulating member adhered to the protruding portions, wherein
the first magnetic sensor and the second magnetic sensor are mounted on the second insulating member, and
the sealing portion is formed between the second insulating member and the first conductor and second conductor.

19. The current sensor according to claim 1, wherein the two end portions of the first conductor and the two end portions of the second conductor are exposed through the same side surface of the sealing portion.

20. The current sensor according to claim 1, wherein the two end portions of the first conductor and the two end portions of the second conductor are aligned and oriented in substantially the same direction.

* * * * *